US012666554B2

(12) United States Patent
Kim

(10) Patent No.: US 12,666,554 B2
(45) Date of Patent: Jun. 23, 2026

(54) WINDOW AND DISPLAY DEVICE

(71) Applicant: Samsung Display Co., LTD., Yongin-si (KR)

(72) Inventor: Sungwon Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 176 days.

(21) Appl. No.: 18/437,488

(22) Filed: Feb. 9, 2024

(65) Prior Publication Data

US 2024/0365494 A1     Oct. 31, 2024

(30) Foreign Application Priority Data

Apr. 27, 2023    (KR) ........................ 10-2023-0055720

(51) Int. Cl.
*H05K 5/03* (2006.01)
*B32B 3/30* (2006.01)
(Continued)

(52) U.S. Cl.
CPC ................. *H05K 5/03* (2013.01); *B32B 3/30* (2013.01); *B32B 17/10* (2013.01); *B32B 17/10018* (2013.01); *B32B 17/10146* (2013.01); *B32B 17/10165* (2013.01); *B32B 27/08* (2013.01); *G06F 1/1652* (2013.01); *G09F 9/301* (2013.01); *B23K 26/0006* (2013.01); *B23K 26/36* (2013.01); *B23K 26/362* (2013.01); *B23K 26/364* (2015.10); *B23K 26/40* (2013.01); *B23K 26/402* (2013.01); *B23K 26/55* (2015.10); *B23K 26/60* (2015.10); *B32B 2307/412* (2013.01);
(Continued)

(58) Field of Classification Search
None
See application file for complete search history.

(56) References Cited

U.S. PATENT DOCUMENTS

| 10,020,462 B1 * | 7/2018 | Ai | ........................ H10K 59/871 |
| 11,627,679 B2 | 4/2023 | Sunwoo et al. | |

(Continued)

FOREIGN PATENT DOCUMENTS

| CN | 205845416 U | * | 12/2016 | |
| CN | 107799574 A | * | 3/2018 | .......... H10W 42/121 |

(Continued)

OTHER PUBLICATIONS

Machine Translation of JPS60248337A, Dec. 1985 (Year: 1985).*
(Continued)

*Primary Examiner* — Jeffrey A Vonch
(74) *Attorney, Agent, or Firm* — CANTOR COLBURN LLP

(57) ABSTRACT

A window includes: a window substrate including a bending portion bendable about a virtual bending axis that extends in a first direction; a plurality of groove patterns, which are defined in the bending portion, extend in the first direction, and are arranged in a second direction crossing the first direction; a sub groove, which is recessed into the window substrate from a pattern surface that define the plurality of at least one of groove patterns; and fillers, which fill the plurality of groove patterns and the sub groove. The sub groove includes a fixing region having a width that increases in a direction in which the sub groove is recessed.

20 Claims, 17 Drawing Sheets

(51) Int. Cl.

| | | |
|---|---|---|
| *B32B 17/10* | (2006.01) |
| *B32B 27/08* | (2006.01) |
| *G06F 1/16* | (2006.01) |
| *G09F 9/30* | (2006.01) |
| *B23K 26/00* | (2014.01) |
| *B23K 26/36* | (2014.01) |
| *B23K 26/362* | (2014.01) |
| *B23K 26/364* | (2014.01) |
| *B23K 26/40* | (2014.01) |
| *B23K 26/402* | (2014.01) |
| *B23K 26/55* | (2014.01) |
| *B23K 26/60* | (2014.01) |
| *C03C 15/00* | (2006.01) |
| *C03C 17/32* | (2006.01) |
| *C03C 23/00* | (2006.01) |
| *H05K 5/02* | (2006.01) |

(52) U.S. Cl.
CPC .......... *B32B 2457/20* (2013.01); *C03C 15/00* (2013.01); *C03C 17/32* (2013.01); *C03C 23/0025* (2013.01); *H05K 5/0217* (2013.01); *Y10T 428/24521* (2015.01); *Y10T 428/24529* (2015.01); *Y10T 428/24537* (2015.01); *Y10T 428/2457* (2015.01); *Y10T 428/24587* (2015.01); *Y10T 428/24612* (2015.01); *Y10T 428/2462* (2015.01)

(56) References Cited

U.S. PATENT DOCUMENTS

| | | | |
|---|---|---|---|
| 11,647,644 B2 | 5/2023 | Sunwoo et al. | |
| 2009/0017242 A1* | 1/2009 | Weber .................. | B23K 26/382 |
| | | | 428/161 |
| 2010/0213174 A1* | 8/2010 | Shin ...................... | B41M 5/262 |
| | | | 156/345.11 |
| 2011/0195277 A1* | 8/2011 | Osaka .................... | G11B 5/855 |
| | | | 977/773 |
| 2014/0029212 A1* | 1/2014 | Hwang .................. | G09F 9/301 |
| | | | 361/749 |
| 2015/0043174 A1* | 2/2015 | Han .................... | G02F 1/13452 |
| | | | 428/156 |
| 2015/0049428 A1* | 2/2015 | Lee ...................... | G06F 1/1652 |
| | | | 361/679.27 |
| 2015/0090969 A1* | 4/2015 | Han .................... | H10K 50/841 |
| | | | 257/40 |
| 2016/0167353 A1* | 6/2016 | Fan .......................... | B32B 7/04 |
| | | | 156/309.9 |
| 2016/0272295 A1* | 9/2016 | Benthien .................. | B32B 7/12 |
| 2017/0092884 A1* | 3/2017 | Zhang ................. | H10K 59/879 |
| 2017/0210058 A1* | 7/2017 | Nishikawa .......... | B23K 26/324 |
| 2017/0229665 A1* | 8/2017 | Park .................... | H10K 77/111 |
| 2017/0259468 A1* | 9/2017 | Nishikawa .......... | B23K 26/352 |
| 2018/0124937 A1* | 5/2018 | Choi ....................... | G09F 9/301 |
| 2018/0143353 A1* | 5/2018 | Kim ..................... | G06F 1/1652 |
| 2018/0149793 A1* | 5/2018 | Gollier .................. | C03C 15/00 |
| 2018/0217639 A1* | 8/2018 | Jones .................. | G06F 1/1616 |
| 2018/0364759 A1* | 12/2018 | Ahn ...................... | B32B 27/281 |
| 2019/0054672 A1* | 2/2019 | Kajihara ................. | B32B 15/20 |
| 2019/0067633 A1* | 2/2019 | Song ................. | G02F 1/133308 |
| 2019/0098785 A1* | 3/2019 | Mintz .................. | H05K 5/0086 |
| 2020/0171781 A1* | 6/2020 | Zhang ...................... | B32B 7/04 |
| 2020/0189210 A1* | 6/2020 | Thayer ................. | B23K 26/355 |
| 2020/0260604 A1* | 8/2020 | Zhang ................. | G06F 1/1652 |
| 2020/0292731 A1* | 9/2020 | Park .................... | G06F 1/1641 |
| 2021/0107826 A1* | 4/2021 | Hwang .............. | C03C 17/3405 |
| 2021/0108077 A1* | 4/2021 | Berleue .............. | C08F 290/067 |
| 2021/0191467 A1* | 6/2021 | Sunwoo ................. | B32B 27/38 |
| 2021/0230052 A1* | 7/2021 | Ikadai .............. | G02F 1/133502 |

| | | | |
|---|---|---|---|
| 2021/0282285 A1* | 9/2021 | Sunwoo .................... | B32B 1/00 |
| 2021/0315116 A1* | 10/2021 | Sunwoo ................. | B32B 27/38 |
| 2022/0006038 A1* | 1/2022 | Park ........................ | H10K 59/38 |
| 2022/0011813 A1* | 1/2022 | Kim .................... | G06F 1/1637 |
| 2022/0043187 A1* | 2/2022 | Choi ...................... | B32B 27/40 |
| 2022/0077432 A1* | 3/2022 | Oh ......................... | H10K 59/87 |
| 2022/0093012 A1* | 3/2022 | Lee ..................... | G06F 1/1616 |
| 2022/0107448 A1* | 4/2022 | Kim ..................... | G02B 5/1814 |
| 2022/0198965 A1* | 6/2022 | Yeon ...................... | G09F 9/301 |
| 2022/0203479 A1* | 6/2022 | Kwon ................. | B23K 26/364 |
| 2022/0209165 A1* | 6/2022 | Hyun ................. | H10K 59/871 |
| 2022/0217863 A1* | 7/2022 | Kim .................... | G06F 1/1656 |
| 2022/0225523 A1* | 7/2022 | Nguyen ............. | H10K 77/111 |
| 2022/0256018 A1* | 8/2022 | Kim .................... | H04M 1/0268 |
| 2022/0301463 A1* | 9/2022 | Kim ........................ | G09F 9/301 |
| 2022/0308266 A1* | 9/2022 | Kim ......................... | G02B 1/04 |
| 2022/0374046 A1* | 11/2022 | Kim ................... | H04M 1/0214 |
| 2022/0376201 A1* | 11/2022 | Kim ................... | H10K 77/111 |
| 2022/0413556 A1* | 12/2022 | Lee ......................... | C03C 15/00 |
| 2023/0115315 A1* | 4/2023 | Han .................... | H10K 59/871 |
| | | | 257/91 |
| 2023/0156116 A1 | 5/2023 | Yoon et al. | |
| 2023/0217620 A1* | 7/2023 | Cha ...................... | G06F 1/1637 |
| | | | 428/167 |
| 2024/0016035 A1* | 1/2024 | Wu ...................... | H10K 59/871 |
| 2024/0023410 A1* | 1/2024 | Xu ....................... | H10K 59/873 |
| 2024/0045477 A1* | 2/2024 | Xu ...................... | G06F 1/1616 |
| 2024/0079442 A1* | 3/2024 | Nguyen .............. | G06F 1/1652 |

FOREIGN PATENT DOCUMENTS

| | | | | | |
|---|---|---|---|---|---|
| CN | 109427251 A | * | 3/2019 | ............. | G09F 9/301 |
| CN | 110211499 A | * | 9/2019 | ............. | G09F 9/33 |
| CN | 209418505 U | * | 9/2019 | | |
| CN | 110874988 A | * | 3/2020 | ............. | G09F 9/301 |
| CN | 111613140 A | * | 9/2020 | ............. | G09F 9/301 |
| CN | 111756889 A | * | 10/2020 | .......... | H04M 1/0216 |
| CN | 113593417 A | * | 11/2021 | ............. | G09F 9/301 |
| CN | 113707018 A | * | 11/2021 | ............. | G09F 9/301 |
| CN | 114360386 A | * | 4/2022 | ............. | G09F 9/33 |
| CN | 114387875 A | * | 4/2022 | ............. | G09F 9/301 |
| CN | 216353073 U | | 4/2022 | | |
| CN | 115466059 A | * | 12/2022 | ............. | H10F 19/80 |
| CN | 115588356 A | * | 1/2023 | ............. | G09F 9/301 |
| JP | 60248337 A | * | 12/1985 | | |
| JP | 2016132156 A | * | 7/2016 | ........ | B29C 65/1616 |
| JP | 2016141092 A | * | 8/2016 | ........ | B29C 65/1616 |
| JP | 2016147404 A | * | 8/2016 | ............ | B23K 26/60 |
| JP | 2020170063 A | * | 10/2020 | | |
| KR | 20160006585 A | * | 1/2016 | ............. | H01L 27/32 |
| KR | 20170023231 A | * | 3/2017 | ............. | G09F 9/301 |
| KR | 20180079093 A | * | 7/2018 | ............. | G09F 9/301 |
| KR | 20200037712 A | * | 4/2020 | .......... | G06F 1/1652 |
| KR | 102181655 B1 | | 11/2020 | | |
| KR | 20210149568 A | * | 12/2021 | ............. | C08L 53/00 |
| KR | 102359719 B1 | | 2/2022 | | |
| KR | 1020220014806 A | | 2/2022 | | |
| KR | 102395734 B1 | | 5/2022 | | |
| KR | 102395748 B1 | | 5/2022 | | |
| WO | WO-2016143521 A1 | * | 9/2016 | ........ | B29C 65/1635 |
| WO | WO-2016143586 A1 | * | 9/2016 | ........ | B29C 65/1616 |
| WO | WO-2016195460 A1 | * | 12/2016 | .......... | H04N 19/176 |
| WO | WO-2020155736 A1 | * | 8/2020 | ......... | H04M 1/0268 |
| WO | WO-2022169102 A1 | * | 8/2022 | ............. | H05K 5/03 |

OTHER PUBLICATIONS

Machine Translation of JP2016132156A, Jul. 2016 (Year: 2016).*
Machine Translation of WO2020155736A1, Aug. 2020 (Year: 2020).*
Machine Translation of KR202100149568A, Dec. 2021 (Year: 2021).*
Machine Translation of CN115466059A, Dec. 2022 (Year: 2022).*

* cited by examiner

WINDOW AND DISPLAY DEVICE

This application claims priority to Korean Patent Application No. 10-2023-0055720, filed on Apr. 27, 2023, and all the benefits accruing therefrom under 35 U.S.C. § 119, the content of which in its entirety is herein incorporated by reference.

BACKGROUND

The present disclosure herein relates to a reliable window and a display device including same.

A display device, such as a smart phone, a digital camera, a notebook computer, a navigation system, and a smart television, provides images to users through display screens. The display device may include a display panel for generating images.

Various types of display devices are being developed. For example, a flexible display device capable of being folded or rolled has been developed. A flexible display device that is deformable in various shapes is easy to carry and may improve user convenience.

In an expandable flexible display device among flexible display devices, at least a portion of a display panel may be accommodated inside a case or drawn out of the case by using folding characteristics of the display panel. Accordingly, the user may expand a display screen. However, the expandable flexible display devices have a limitation in that display panels and windows may be damaged by the expansion.

SUMMARY

The present disclosure provides a window having improved bending reliability and a display device including same.

An embodiment of the invention provides a window that includes: a window substrate, a plurality of groove patterns, and fillers. The window substrate includes a bending portion bendable about a virtual bending axis that extends in a first direction. The plurality of groove patterns are defined in the bending portion, extend in the first direction, and are arranged in a second direction crossing the first direction. A sub groove is recessed into the window substrate from a pattern surface that defines at least one of the plurality of groove patterns. The fillers fill the plurality of groove patterns and the sub groove. The sub groove includes a fixing region having a width that increases in a direction in which the sub groove is recessed.

In an embodiment, the plurality of groove patterns may include a first groove pattern recessed from an upper surface of the window substrate and a second groove pattern recessed from a lower surface of the window substrate.

In an embodiment, the sub groove may include an upper sub groove provided in the first groove pattern and a lower sub groove provided in the second groove pattern.

In an embodiment, the first groove pattern and the second groove pattern may not overlap each other in a thickness direction of the window substrate.

In an embodiment, the sub groove may be provided in plurality, and each of the plurality of groove patterns may be provided with a plurality of sub grooves.

In an embodiment, in a cross-sectional view perpendicular to the first direction, the pattern surface may be separated into two sections by the sub groove, and a maximum width of the sub groove may be greater than a gap between the two sections of the pattern surface.

In an embodiment, the sub groove may include a first sub groove adjacent to the pattern surface and a second sub groove extending from the first sub groove to the inside of the window substrate.

In an embodiment, in a cross-sectional view perpendicular to the first direction, a width of the first sub groove may be constant in the direction in which the sub groove is recessed.

In an embodiment, in the cross-sectional view perpendicular to the first direction, a maximum width of the second sub groove may be greater than a maximum width of the first sub groove.

In an embodiment, the second sub groove may include the fixing region.

In an embodiment, a cross-section of the second sub groove perpendicular to the first direction may have a circular shape.

The window according to an embodiment of the invention may further include a window cover layer on the window substrate.

In an embodiment, the window substrate may further include a first non-bending portion and a second non-bending portion which are spaced apart from each other in the second direction with the bending portion therebetween.

In an embodiment of the invention, a display device operates in a first mode and a second mode in which a display surface is larger than in the first mode. The display device includes: a display panel, a window substrate, a plurality of groove patterns, a sub groove, and fillers. The display panel includes a display bending portion bendable about a virtual bending axis that extends in a first direction. The window substrate is disposed on the display panel and includes a bending portion corresponding to the display bending portion. The plurality of groove patterns are defined in the bending portion, extend in the first direction, and are arranged in a second direction crossing the first direction. The sub groove is recessed into the window substrate from a pattern surface that defines at least one of the plurality of groove patterns. The fillers fill the plurality of groove patterns and the sub groove. The sub groove includes a fixing region having a width that increases in a direction in which the sub groove is recessed.

In an embodiment of the invention, a window includes: a window substrate including a bending portion bendable about a virtual bending axis that extends in a first direction; a plurality of groove patterns, which are defined in the bending portion, extend in the first direction, and are arranged in a second direction crossing the first direction; a sub groove, which is recessed into the window substrate from a pattern surface that defines at least one of the plurality of groove patterns; and fillers, which fill the plurality of groove patterns and the sub groove, where the sub groove has an anchor shape such that the fillers are fixed to the sub groove.

In an embodiment, the sub groove may include a fixing region having a width that increases in a direction in which the sub groove is recessed.

In an embodiment, the sub groove may include: a first sub groove adjacent to the pattern surface; and a second sub groove extending from the first sub groove to the inside of the window substrate, where in a cross-sectional view perpendicular to the first direction, a maximum width of the second sub groove may be greater than a maximum width of the first sub groove.

In an embodiment, the second sub groove may include the fixing region.

In an embodiment, a cross-section of the second sub groove perpendicular to the first direction may have a circular shape.

In an embodiment, in a cross-sectional view perpendicular to the first direction, the pattern surface may be separated into two sections by the sub groove, and a maximum width of the sub groove may be greater than a gap between the two sections of the pattern surface.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

Figure 1A:
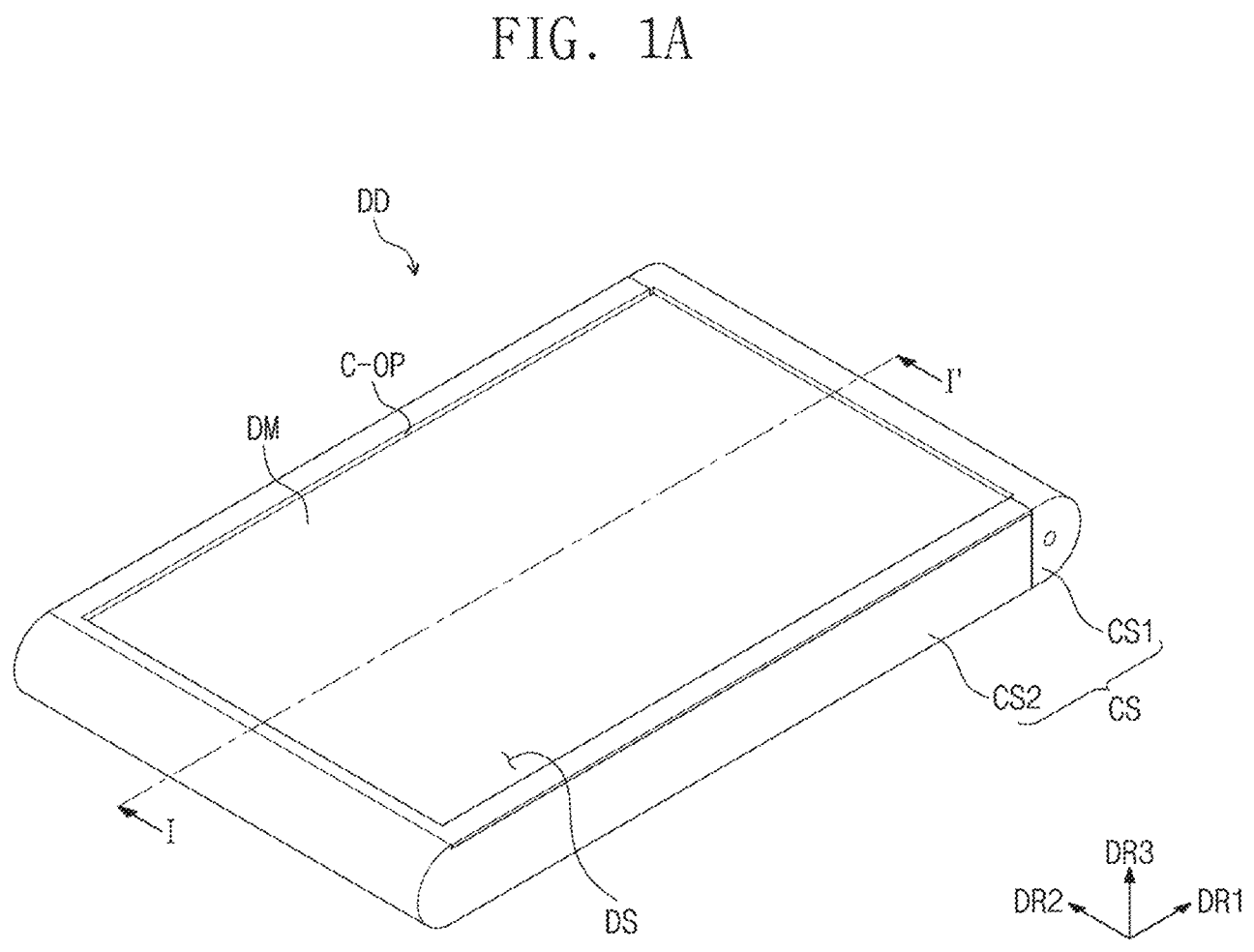

FIG. 1A is a perspective view of a display device according to an embodiment of the invention;

DETAILED DESCRIPTION

Figure 1B:
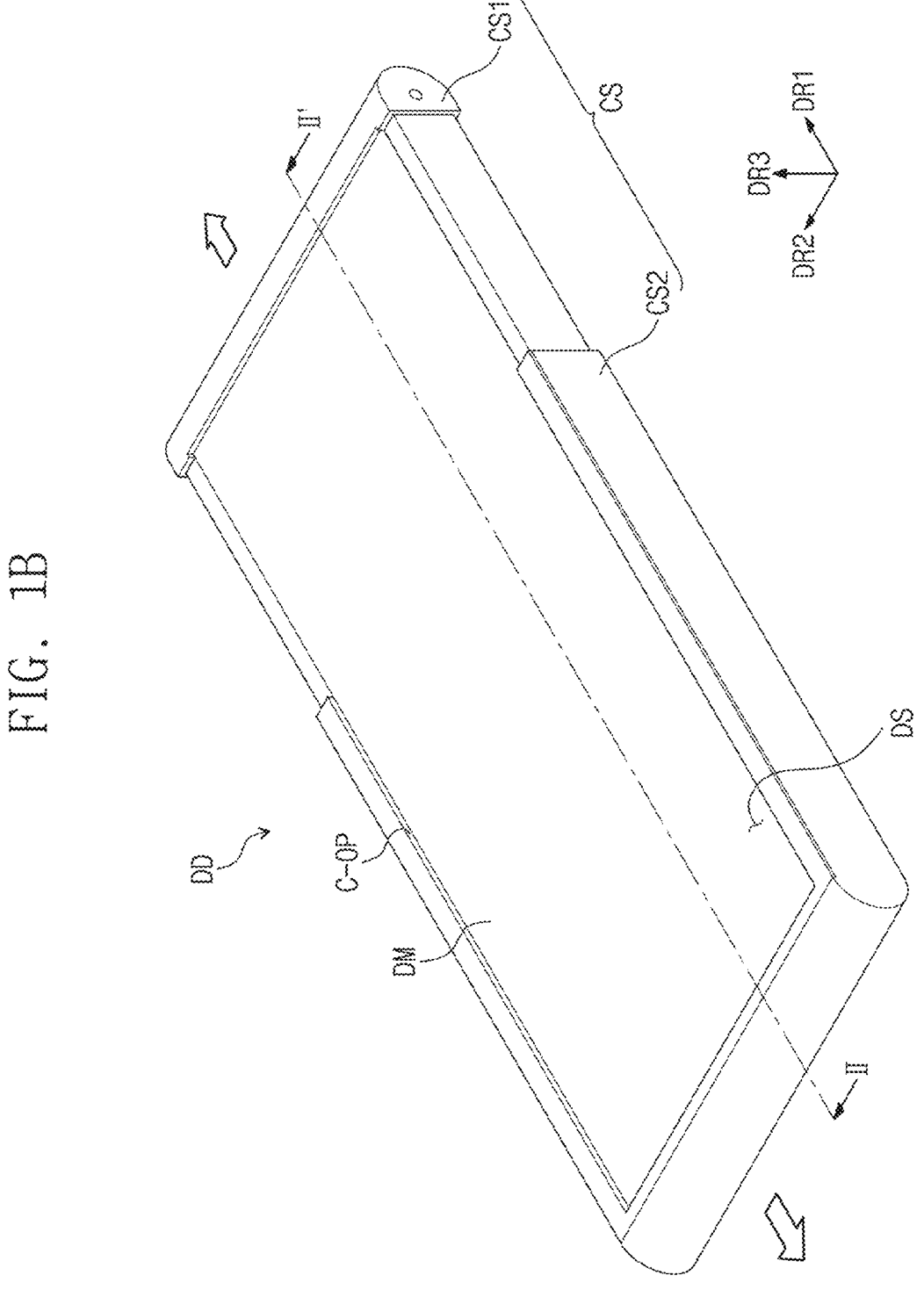
FIG. 1B is a perspective view of the display device according to an embodiment of the invention.

Since the invention may have various modifications and be embodied in different forms, specific embodiments are illustrated in the drawings and described in detail in the description. However, this is not intended to limit the invention to the specific embodiments, and it should be understood that the present disclosure covers all the modifications, equivalents, and replacements within the idea and technical scope of the invention.

In the specification, it will be understood that when an element (or a region, a layer, a portion, or the like) is referred to as being "on", "connected to", or "coupled to" another element, it can be directly disposed on, connected to, or coupled to another element mentioned above, or intervening elements may be disposed therebetween.

Like numbers refer to like elements throughout. Also, in the drawings, the thicknesses, ratios, and dimensions of the elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items.

Although the terms "first," "second," etc. may be used herein to describe various elements, these elements should not be limited by these terms. These terms are only used to distinguish one element from another element. For example, a first element may be referred to as a second element, and similarly, a second element may also be referred to as a first element without departing from the scope of the present disclosure. The singular forms include the plural forms as well, unless the context clearly indicates otherwise.

Also, terms, such as "below," "lower," "above," and "upper" may be used to describe the relationships of the components illustrated in the drawings. These terms are used as a spatially relative concept and are described based on the directions indicated in the drawings.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art, and will not be interpreted in an idealized or overly formal sense unless expressly so defined herein.

It will be understood that the term "includes" or "comprises," when used herein, specifies the presence of stated features, integers, steps, operations, elements, components, or a combination thereof, but does not preclude the presence or addition of one or more other features, integers, steps, operations, elements, components, or combinations thereof.

Hereinafter, embodiments of the invention are described with reference to the drawings.

FIGS. 1A and 1B are perspective views of a display device according to an embodiment of the invention. FIG. 1A is a perspective view of a display device DD operating in a first mode, and FIG. 1B is a perspective view of the display device DD operating in a second mode.

The display device DD may include a device which is activated in response to an electrical signal and displays an image. The display device DD may include various embodiments. For example, the display device DD may include large scale devices, such as a television and an outdoor advertising board, and small-to-medium devices, such as a smartphone, a mobile phone, a tablet computer, a navigation unit, and a game console. In the embodiment, the display device DD is illustrated as a smartphone capable of sliding.

Referring to FIGS. 1A and 1B, the display device DD may include a display module DM and a case CS accommodating the display module DM. At least a portion of the display module DM may be exposed to the outside through a display opening C-OP defined in the upper portion of the case CS.

The case CS may include a first case CS1 and a second case CS2. The first case CS1 and the second case CS2 may be coupled to each other to accommodate the display module DM. The first case CS1 may be coupled to the second case CS2 so as to move in a direction parallel to a first direction DR1. The first case CS1 is coupled to the second case CS2 and may move closer to or away from the second case CS2.

A display surface DS of the display module DM exposed through the display opening C-OP may be parallel to both the first direction DR1 and a second direction DR2 crossing the first direction DR1. The display device DM may display an image, in a third direction DR3, on the display surface DS parallel to the first direction DR1 and the second direction DR2.

As used herein, the third direction DR3 may be defined as a direction that substantially perpendicularly crosses the plane defined by the first direction DR1 and the second direction DR2. The front surface (or upper surface) and the rear surface (or lower surface) of each of members constituting the display device DD may be opposed to each other in the third direction DR3, and a normal direction of each of the front and rear surfaces may be substantially parallel to the third direction DR3. A distance between the front surface and the rear surface defined in the third direction DR3 may correspond to the thickness of a member (or a unit).

As used herein, the expression of "in a plan view" may be defined as a state when viewed in the third direction DR3. As used herein, the expression of "in a cross-sectional view" may be defined as a state when viewed in the first direction DR1 or the second direction DR2. Here, directions indicated as the first to third directions DR1, DR2, and DR3 may have a relative concept and thus may be changed to other directions.

Referring to FIGS. 1A and 1B, the area of the display surface DS of the display module DM exposed through the display opening C-OP of the case CS is adjusted according to the movement of the first case CS1. As the first case CS1 moves, the opening area of the display opening C-OP may increase in the first direction DR1.

The display module DM may include a flexible display module and may be supported by a support layer disposed below the display module DM. When the first case CS1 moves in the first direction DR1, the support layer connected to the first case CS1 may also move in the first direction DR1. Accordingly, the display module DM disposed on the support layer may also move in the first direction DR1 according to the movement of the first case CS1. As the end of the display module DM moves along with the first case CS1 in the first direction DR1, a portion of the display module DM accommodated in the second case CS2 in the first mode may be exposed to the outside. Accordingly, the display surface DS of the display module DM exposed through the display opening C-OP may be enlarged.

FIG. 1A illustrates the display device DD in the first mode among operation states of the display device DD, in which the first case CS1 is located closest to the second case CS2 in the first direction DR1. In the first mode, a portion extending from a region of the display module DM exposed through the display opening C-OP may be folded at a certain curvature and accommodated in the second case CS2. The first mode in which the display surface DS of the display module DM is set to a basic size may be defined as a basic mode.

FIG. 1B illustrates the display device DD in the second mode among operation states of the display device DD, in which the first case CS1 is located farthest away from the second case CS2 in the first direction DR1. In the display device DD of the second mode compared to the first mode, the area of the display surface DS of the display module DM exposed through the display opening C-OP may be expanded. That is, the second mode in which the display surface DS is expanded from the basic mode may be defined as an expansion mode.

The first mode and the second mode of the display device DD may be determined by sliding motions of the case CS and the display module DM. A user may expand the display surface DS of the display device DD by operating the display device DD from the first mode to the second mode and may view an image through the expanded display surface DS. Also, the user may reduce the display surface DS of the display device DD by operating the display device DD from the second mode to the first mode and may view the image through the reduced display surface DS. That is, the user may diversely adjust the area of the display surface of the display device DD exposed from the case CS by selecting one of the first mode and the second mode of the display device DD.

Figure 2A:
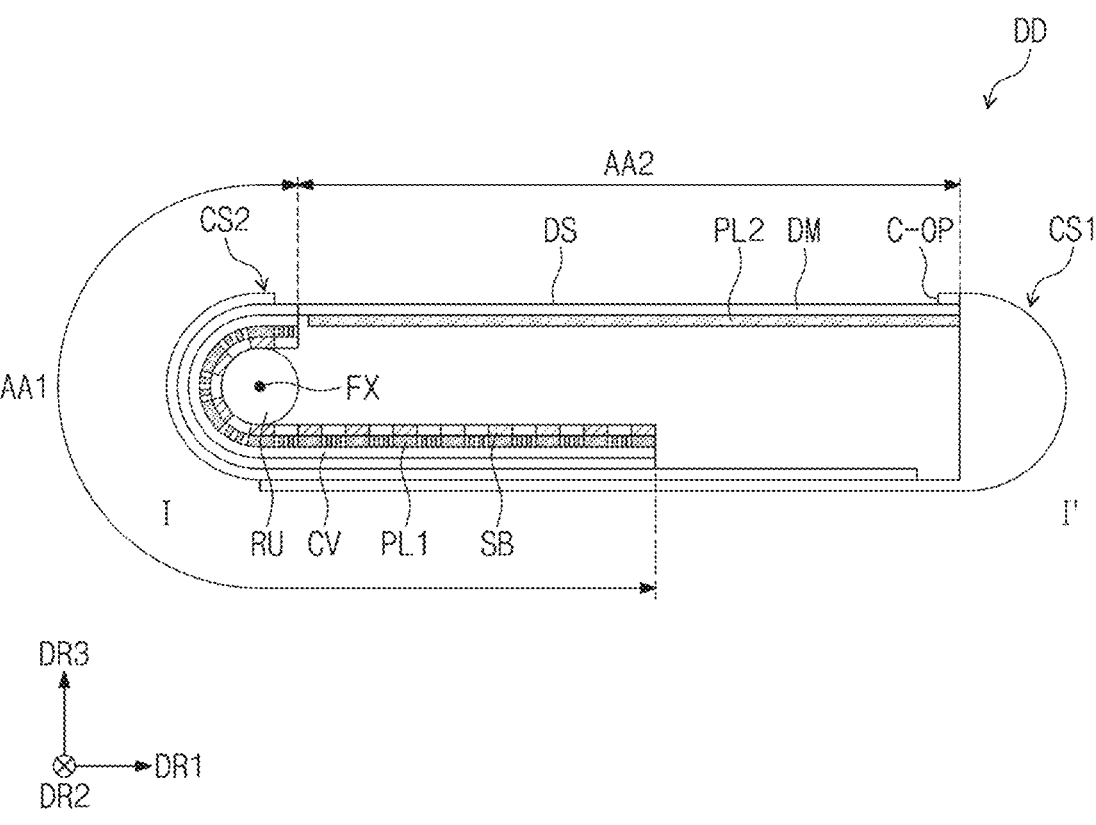
FIG. 2A is a cross-sectional view of the display device according to an embodiment of the invention, taken along line I-I' of FIG. 1A.
Figure 2B:
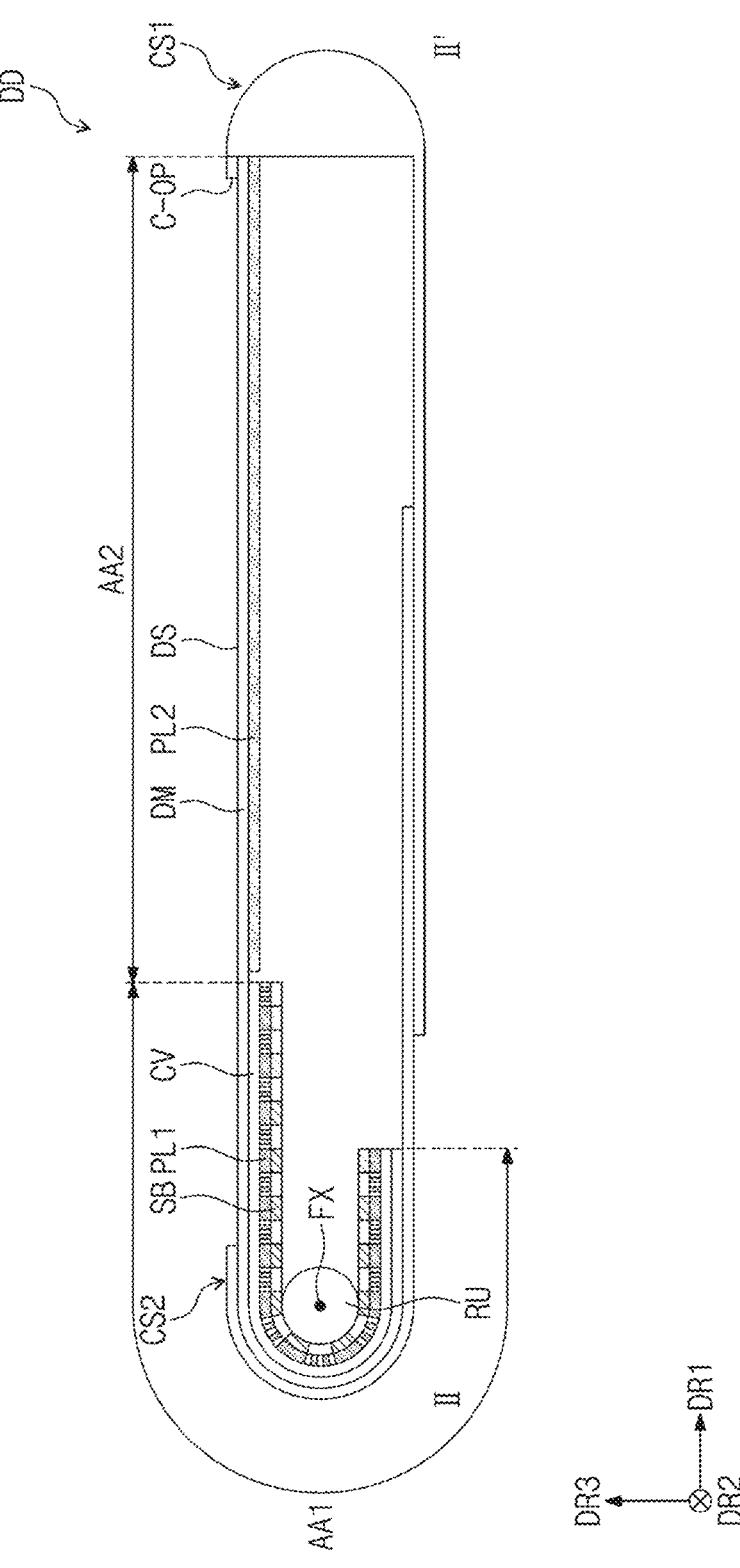
FIG. 2B is a cross-sectional view of the display device according to an embodiment of the invention, taken along line II-II' of FIG. 1B.

FIGS. 2A and 2B are cross-sectional views of the display device DD according to an embodiment of the invention. FIG. 2A is a cross-sectional view of the display device DD according to an embodiment, taken along line I-I' of FIG. 1A. FIG. 2B is a cross-sectional view of the display device DD according to an embodiment of the invention, taken along line II-II' of FIG. 1B. FIG. 2A corresponds to the cross-section of the display device DD in the first mode and FIG. 2B corresponds to the cross-section of the display device DD in the second mode.

Referring to FIGS. 2A and 2B, the display device DD may include a case CS, a display module DM accommodated in the case CS, a rotation unit RU, and a support module. The support module may be disposed below the display module DM to support the display module DM. The support module may include a cover member CV, a first support layer PL1, a second support layer PL2, and support bars SB.

The display module DM may include a first region AA1 and a second region AA2 extending from the first region AA1 in the first direction DR1. The first region AA1 may be supported by the cover member CV and the first support layer PL1, and the second region AA2 may be supported by the second support layer PL2.

Referring to FIG. 2A, in the first mode, the display surface DS of the display module DM corresponding to the second region AA2 may be exposed to the outside. In the first mode, the second region AA2 may be provided parallel to the first and second directions DR1 and DR2, and the second region AA2 may be defined as a planar region or a non-bending region. A portion of the first region AA1 may be folded such that an end thereof spaced apart from the second region AA2 overlaps the second region AA2 in the third direction DR3. In detail, a portion of the first region AA1 may be folded about a rotation axis FX parallel to the second direction DR2. The first region AA1 may be defined as a folding region or a bending region. In the first mode, at least a portion of the first region AA1 may not be exposed to the outside. As illustrated in FIG. 2A, in the first mode, only a portion of the first region AA1 adjacent to the second region AA2 may be exposed to the outside. As used herein, "a region/portion corresponds to another region/portion" indicates that they overlap each other but are not limited to having the same area.

The rotation unit RU may be accommodated inside the second case CS2. The rotation unit RU may rotate about the rotation axis FX parallel to one direction. FIGS. 2A and 2B illustrate the rotation unit RU that is rotatable about the rotation axis FX parallel to the second direction DR2. The rotation unit RU is coupled to the second case CS2 and may rotate about the rotation axis FX according to a sliding motion of the first case CS1 moving away from or toward the second case CS2.

The first case CS1 of FIG. 2A may move away from the second case CS2 in the first direction DR1 and may be then placed in the second mode of FIG. 2B. When the display device DD is operated from the first mode to the second mode, the end of the second region AA2 of the display module DM, which is spaced apart from the first region AA1, is coupled and fixed to the first case CS1 and may be moved along with the movement of the first case CS1. Here, the end of the first region AA1 of the display module DM, which is spaced apart from the second region AA2, moves in a direction opposite to the direction in which the end of the second region AA2 coupled to the first case CS1 moves.

A portion of the first region AA1 of the display module DM and portions of the cover member CV, the first support layer PL1, and the support bars SB supporting the first region AA1 of the display module DM may be disposed on a curved surface of the rotation unit RU and folded to a certain curvature. When operating from the first mode to the second mode, as the display module DM moves, the first region AA1 of the display module DM, the cover member CV, the first support layer PL1, and the support bars SB may move along the curved surface of the rotation unit RU. According to an embodiment, a portion of the display surface DS corresponding to the first region AA1 in the first mode may be exposed to the outside. Then, when operating from the first mode to the second mode, the area of the first region AA1 exposed to the outside through the display opening C-OP may increase. Also, in the first mode, the display surface DS corresponding to the first region AA1 may not be exposed to the outside.

A support module for supporting the first region AA1 folded along the curved surface of the rotation unit RU in the first and second modes and a support module for supporting the second region AA2 maintained in a flat state in the first and second modes may have different configurations as the desirable mechanical properties are different from each other. In an embodiment, for example, the support module for supporting the first region AA1 of the display module DM may include the cover member CV, the first support layer PL1, and the support bars SB. Also, the support module for supporting the second region AA2 may include the second support layer PL2.

Since the support modules have different configurations according to the regions of the display module DM, a gap may exist between components of the support modules arranged side by side in a plan view. In an embodiment, for example, the cover member CV and the second support layer PL2 arranged, as separate components, side by side in a plan view may be spaced apart from each other in the first direction DR1. That is, a gap may exist between the cover member CV and the second support layer PL2.

The cover member CV, the first support layer PL1, the second support layer PL2, and the support bars SB are described below in detail with reference to drawings.

Figure 3:
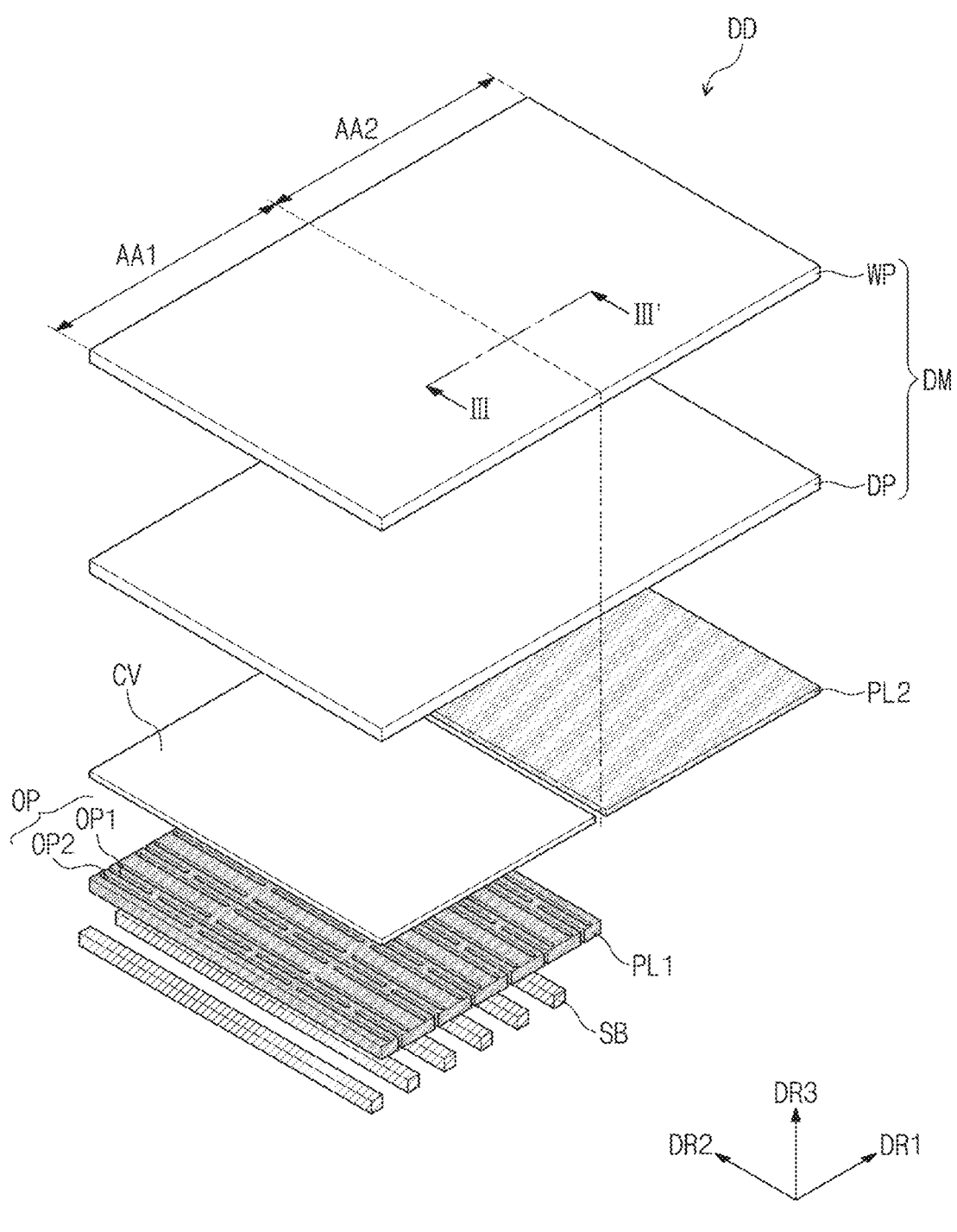
FIG. 3 is an exploded perspective view of the display device according to an embodiment of the invention.

FIG. 3 is an exploded perspective view of a display device DD according to an embodiment of the invention. The descriptions given above may be applied, in the same manner, to components illustrated in FIG. 3. The cover member CV, the first support layer PL1, the second support layer PL2, and the support bars SB are mainly described with reference to FIG. 3.

Referring to FIG. 3, the display module DM may include a display panel DP and a window WP disposed on the display panel DP. The window WP may cover the entire upper surface of the display panel DP. The window WP may protect the display panel DP from external impacts and scratches.

The window WP may include an optically transparent insulating material. In an embodiment, for example, the window WP may include glass, sapphire, or polymer. The window WP may have a single- or multi-layer structure. The window WP may further include functional layers, such as an anti-fingerprint layer, a phase control layer, and a hard coating layer, which are disposed on an optically transparent substrate. The window WP is described below in detail.

Also, the configuration of the display module DM is not limited thereto and may further include functional layers disposed between the window WP and the display panel DP. In an embodiment, for example, the display module DM may further include at least one of a protection layer, an anti-reflection layer, and an input sensing layer disposed on the display panel DP.

The display panel DP may include a first region AA1 and a second region AA2. These regions may correspond to the first region AA1 and the second region AA2 of the display module DM described above, and thus, the description given above may be applied thereto in the same manner. In FIG. 3, the first region AA1 and the second region AA2 are shown above the upper surface of the window WP for convenience of description.

The display panel DP according to an embodiment may include a light emitting display panel, but the embodiment is not particularly limited thereto. In an embodiment, for example, the display panel DP may include an organic light emitting display panel or an inorganic light emitting display panel. A light emitting layer of the organic light emitting display panel may include organic light emitting materials. A light emitting layer of the inorganic light emitting display panel may include inorganic light emitting materials, such as quantum dots and quantum rods. Also, the light emitting layer of the display panel may include ultra-small light emitting elements, such as micro LEDs and/or nano LEDs. The display panel DP according to an embodiment is described below in detail with reference to FIGS. 4 and 5.

The cover member CV may be disposed on the bottom surface of the display panel DP. The cover member CV may overlap the first region AA1 of the display panel DP in a plan view. The cover member CV may be parallel to each of the first and second directions DR1 and DR2 in an unfolded state. The cover member CV may protect the bottom surface of the display panel DP corresponding to the first region AA1 and may not overlap the second region AA2 in a plan view.

The cover member CV may include a flexible material. In an embodiment, for example, the cover member CV may include a polymer material. The cover member CV supports the first region AA1 of the display panel DP folded at a certain curvature, thereby relieving stress caused by folding. In addition, the cover member CV may prevent foreign substances from entering the display panel DP through openings OP that are defined in the first support layer PL1 disposed below the cover member CV. The second region AA2, which is not folded even during operation in the first mode and the second mode, does not require stress relief by folding, and an opening is not defined in the second support layer PL2 disposed below the display panel DP. Therefore, the cover member CV may not be provided in the second region AA2. Accordingly, a stack structure of the display device DD corresponding to the second region AA2 may be simplified.

The second support layer PL2 may be disposed on the bottom surface of the display panel DP. The second support layer PL2 may overlap the second region AA2 of the display panel DP in a plan view. The second support layer PL2 may have a plate shape parallel to the first and second directions DR1 and DR2. The second support layer PL2 may protect the bottom surface of the display panel DP corresponding to the second region AA2 and may not overlap the first region AA1 in a plan view.

The second support layer PL2 may include a material having a certain rigidity. In an embodiment, for example, the second support layer PL2 may include stainless steel, aluminum, or an alloy thereof. However, the material of the second support layer PL2 is not limited to the above examples. The second support layer PL2 may support the bottom surface of the display panel DP so that the second region AA2 of the display panel DP maintains a flat state in the first mode and the second mode. Also, the second support layer PL2 may improve impact resistance of the display panel DP.

The cover member CV may include a material different from a material of the second support layer PL2. The second support layer PL2 may have a modulus higher than a modulus of the cover member CV. The cover member CV is not limited to one embodiment as long as it can support the first region of the display panel DP to relieve stress caused by folding. In addition, the second support layer PL2 is not limited to one embodiment as long as it can support the second region AA2 of the display panel DP so as to be flat.

The cover member CV and the second support layer PL2 may be arranged parallel to each other on the bottom surface of the display panel DP. In an embodiment, for example, one end of the cover member CV may face one end of the second support layer PL2 in the first direction DR1. The cover member CV may be spaced apart from the second support layer PL2 in the first direction DR1.

The first support layer PL1 may be disposed below the cover member CV. The first support layer PL1 may overlap the first region AA1 of the display panel DP in a plan view. The first support layer PL1 may be parallel to each of the first and second directions DR1 and DR2 in an unfolded state. The first support layer PL1 may not overlap the second region AA2 in a plan view. The first support layer PL1 may be spaced apart from the second support layer PL2 in a plan view.

The first support layer PL1 may include a material having a certain rigidity. Accordingly, the first support layer PL1 may improve impact resistance of the display panel DP corresponding to the first region AA1. In an embodiment, for example, the first support layer PL1 may include stainless steel, aluminum, or an alloy thereof. In an embodiment, the first support layer PL1 may include the same material as the second support layer PL2. However, the material of the first support layer PL1 is not limited to the above examples.

A plurality of openings OP passing through the first support layer PL1 may be defined in the first support layer PL1. The first support layer PL1 may be relatively easily folded by the openings OP. That is, the first support layer PL1 has rigidity and may be easily folded at a certain curvature by the openings OP.

Each of the openings OP may extend in the second direction DR2. That is, the width of the openings OP in the second direction DR2 may be greater than the width in the first direction DR1. The openings OP may be arranged in a lattice shape. Accordingly, a lattice pattern may be defined in the first support layer PL1 by the openings OP.

The openings OP may include first openings OP1 and second openings OP2 which are arranged to be offset from each other in a direction parallel to the first direction DR1. The first openings OP1 and the second openings OP2 may be arranged in a row in the second direction DR2. However, this is merely illustrated as an example. All of the plurality of openings OP according to an embodiment may be arranged side by side in the second direction DR2 and are not limited to any one embodiment.

FIG. 3 illustrates that the openings OP are provided as a plurality of groups arranged in the second direction DR2. Here, one group includes first openings OP1 provided in one row and second openings OP2 located on opposite sides of the first openings OP1. However, this is merely illustrated as an example. The arrangement and gaps of the openings OP may be designed in various ways according to the design of the display device DD and are not limited to any one embodiment.

The support bars SB may be disposed below the first support layer PL1. Each of the support bars SB may extend in the second direction DR2. The support bars SB may be spaced apart from each other in the first direction DR1. The support bars SB are provided as segmented bodies so that the first region AA1 of the display panel DP may be easily folded along the curved surface of the rotation unit RU (refer to FIG. 2A).

The support bars SB may not overlap the openings OP of the first support layer PL1 in a plan view. Accordingly, the support bars SB may not deteriorate the folding characteristics of the first support layer PL1. However, the embodiment is not necessarily limited thereto, and some of the support bars SB may overlap the openings OP in a plan view in another embodiment.

The support bars SB may include metal having a certain rigidity. In an embodiment, for example, the support bars SB may include metal, such as aluminum, stainless steel, or invar, or carbon fiber. However, the material of the support bars SB is not limited to the above examples as long as the support bars SB are provided as segmented bodies capable of supporting the first region AA1 of the display panel DP.

Figure 4:
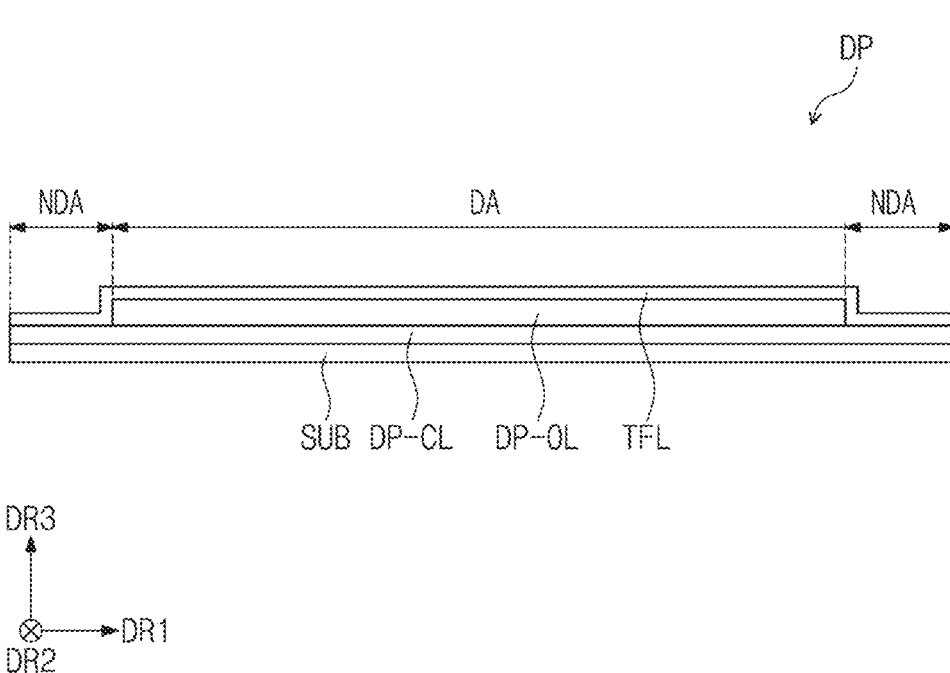
FIG. 4 is a cross-sectional view of the display panel according to an embodiment of the invention.
Figure 5:
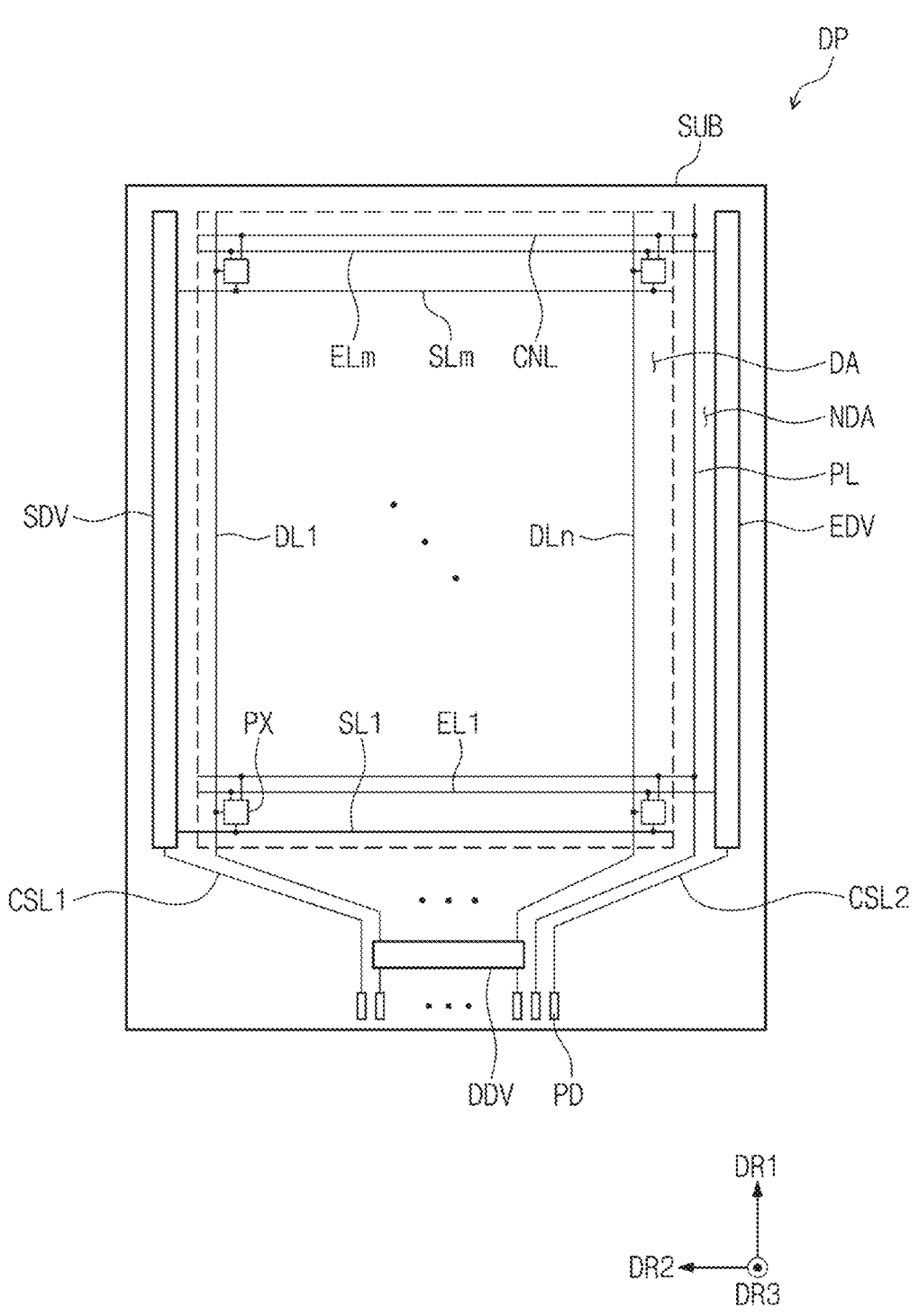
FIG. 5 is a plan view of the display panel according to an embodiment of the invention.

FIG. 4 is a cross-sectional view of a display panel according to an embodiment of the invention. FIG. 5 is a plan view of a display panel according to an embodiment of the invention.

Referring to FIG. 4, the display panel DP may include a base substrate SUB, a circuit element layer DP-CL, a display element layer DP-OL, and an encapsulation layer TFL. The circuit element layer DP-CL, the display element layer DP-OL, and the encapsulation layer TFL may be sequentially stacked on the base substrate SUB in the third direction DR3.

The base substrate SUB may provide a base surface on which elements and lines of the display panel DP are arranged in a plan view parallel to each of the first and second directions DR1 and DR2. The display module SUB may include a display region DA and a non-display region NDA. The display region DA may include a region in which pixels are arranged to display an image. The non-display region NDA may include a region which is adjacent to the display region DA and does not display an image. The non-display region NDA may include a region in which the lines connected to the pixels and transmitting driving signals are arranged.

The base substrate SUB may include a flexible plastic substrate. In an embodiment, for example, the base substrate SUB may include at least one synthetic resin layer. The synthetic resin layer may include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, a perylene-based resin, or a poly-imide-based resin. However, the material of the base substrate SUB is not limited to the above examples.

The circuit element layer DP-CL may be disposed on the base substrate SUB. The circuit element layer DP-CL may include at least one insulating layer, driving elements, signal lines, and signal pads. The circuit element layer DP-CL may include conductive patterns and semiconductor patterns that constitute the driving elements, the signal lines, and the signal pads.

The display element layer DP-OL may be disposed on the circuit element layer DP-CL. The display element layer DP-OL may include light emitting elements that overlap the display region DA in a plan view. The light emitting elements of the display element layer DP-OL are electrically connected to the driving elements of the circuit element layer DP-CL and may generate light in the display region DA in response to signals provided from the driving elements.

The encapsulation layer TFL may be disposed on the display element layer DP-OL and seal the light emitting elements. The encapsulation layer TFL may include a plurality of thin films. The thin films of the encapsulation layer TFL may be disposed to improve optical efficiency of the light emitting element or to protect the light emitting element. In an embodiment, the encapsulation layer TFL may include at least one inorganic film and at least one organic film. The inorganic film of the encapsulation layer TFL may protect the light emitting element from moisture/oxygen. The organic film of the encapsulation layer TFL may protect the light emitting element from foreign substances such as dust particles.

Referring to FIG. 5, the display panel DP may include a base substrate SUB, a plurality of pixels PX, a plurality of signal lines SL1 to SLm, DL1 to DLn, EL1 to Elm, CSL1, CSL2, PL, and CNL electrically connected to the pixels PX, a scan driver SDV, a data driver DDV, and an emission driver EDV.

Each of the pixels PX may include a light emitting element, a plurality of transistors (e.g., a switching transistor, a driving transistor, etc.) connected to the light emitting element, and a pixel driving circuit including at least one capacitor.

The pixels PX may be arranged in the display region DA. Each of the pixels PX may emit light in response to an electrical signal applied to the pixel PX. However, some of the pixels PX may include thin film transistors arranged in the non-display region NDA and are not limited to any one embodiment.

Each of the scan driver SDV, the data driver DDV, and the emission driver EDV may be disposed in the non-display region NDA. However, the embodiment is not limited thereto. At least one of the scan driver SDV, the data driver DDV, or the emission driver EDV may be disposed in the display region DA, and thus, the area of the non-display region NDA may be reduced in another embodiment.

The data driver DDV may be provided in the form of an integrated circuit chip defined as a driving chip and mounted in the non-display region NDA of the display panel DP. However, the embodiment is not limited thereto, and the data driver DDV may be mounted on a separate flexible circuit board connected to the display panel DP and may be electrically connected to the display panel DP in another embodiment.

The signal lines SL1 to SLm, DL1 to DLn, EL1 to ELm, CSL1, CSL2, PL, and CNL may include scan lines SL1 to SLm, data lines DL1 to DLn, emission lines EL1 to Elm, first and second control lines CSL1 and CSL2, a power line PL, and connection lines CNL. Here, m and n represent natural numbers.

The data lines DL1 to DLn may be insulated from and cross the scan lines SL1 to SLm and the emission lines EL1 to ELm. In an embodiment, for example, the scan lines SL1 to SLm may extend in the second direction DR2 and may be connected to the scan driver SDV. The data lines DL1 to DLn may extend in the first direction DR1 and may be connected to the data driver DDV. The emission lines EL1 to ELm may extend in the second direction DR2 and may be connected to the emission driver EDV.

The power line PL may extend in the first direction DR1 and may be located in the non-display region NDA. In an embodiment, the power line PL may be located between the display region DA and the emission driver EDV. However, the arrangement position of the power line PL is not limited thereto.

The connection lines CNL may extend in the second direction DR2 and may be arranged in the first direction DR1 and connected to the power line PL and the pixels PX. Each of the connection lines CNL may be located on a different layer from the power line PL and electrically connected to each other through a contact hole. However, the embodiment is not limited thereto, and the connection lines CNL and the power line PL may be integrated with each other on the same layer in another embodiment. A power voltage may be applied to the pixels PX through the power line PL and the connection lines CNL which are connected to each other.

The first control line CSL1 may be connected to the scan driver SDV. The second control line CSL2 may be connected to the emission driver EDV.

Pads PD may be arranged adjacent to the lower end of the non-display region NDA. The pads PD may be arranged closer to the lower end of the display panel DP than the data driver DDV. The pads PD may be spaced apart from each other in the second direction DR2. The pads PD may include parts to which a circuit board providing signals for controlling operations of the scan driver SDV, the data driver DDV, and the emission driver EDV of the display panel DP is connected.

Each of the pads PD may be connected to a corresponding signal line among the signal lines. The power line PL and the first and second control lines CSL1 and CSL2 may be connected to the pads PD. The data lines DL1 to DLn may be electrically connected to the corresponding pads PD through the data driver DDV.

The scan driver SDV may generate scan signals in response to a scan control signal. The scan signals may be applied to the pixels PX through the scan lines SL1 to SLm. The data driver DDV may generate data voltages, which correspond to the image signals, in response to a data control signal. The data voltages may be applied to the pixels PX through the data lines DL1 to DLn. The emission driver EDV may generate emission signals in response to an emission control signal. The emission signals may be applied to the pixels PX through the emission lines EL1 to ELm.

The pixels PX may receive the data voltages in response to the scan signals. The pixels PX may emit light, which has luminance corresponding to the data voltages, in response to the emission signals, thereby displaying an image. An emission time of the pixels PX may be controlled by the emission signals. Accordingly, the display panel DP may output an image through the display region DA using the pixels PX.

Figure 6:
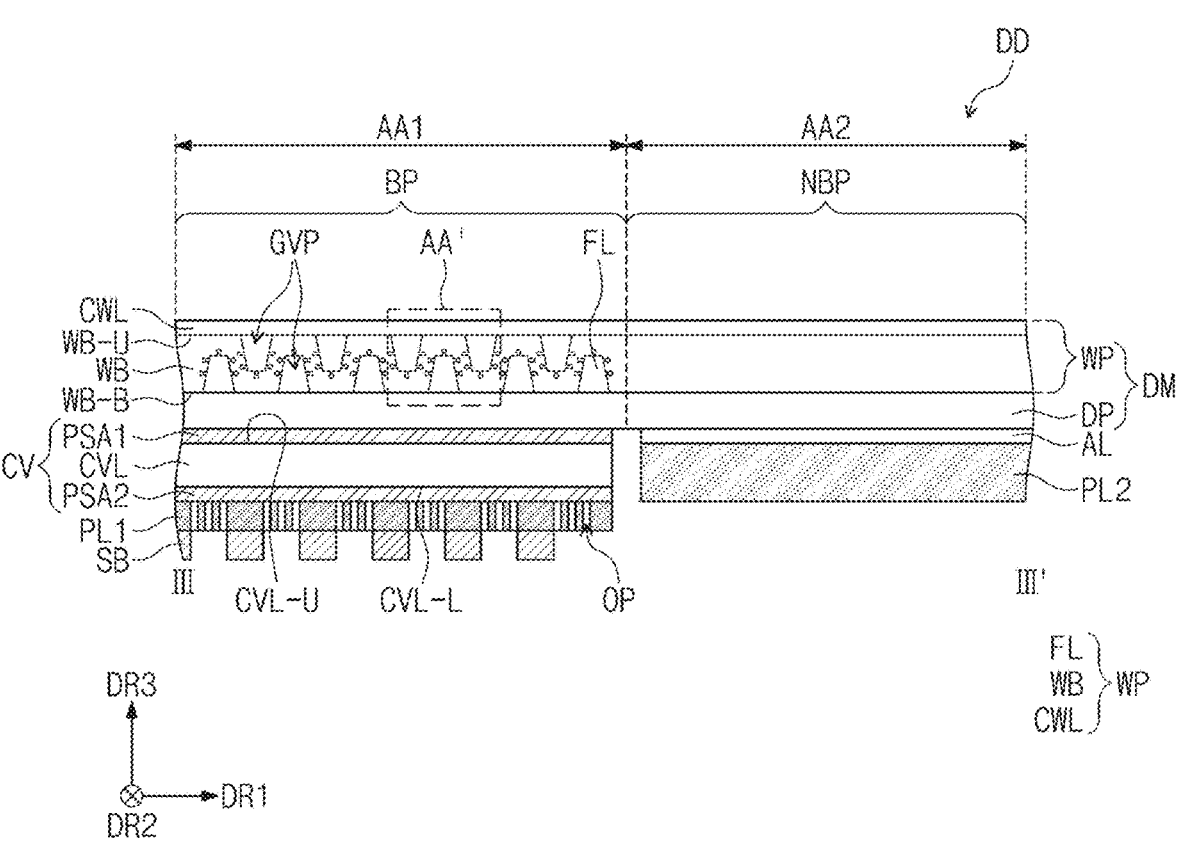
FIG. 6 is a cross-sectional view of the display device according to an embodiment of the invention, taken along line III-III' of FIG. 3.

FIG. 6 is a cross-sectional view of a display device according to an embodiment of the invention. FIG. 6 illustrates a cross-section taken along line III-III' of FIG. 3. The descriptions given above may be applied, in the same manner, to each of components illustrated in FIG. 6 and repeated descriptions thereof are omitted.

Referring to FIG. 6, a cover member CV, a first support layer PL1, and support bars SB are sequentially disposed on the bottom surface of a display panel DP corresponding to a first region AA1 and may support the display panel DP. A second support layer PL2 is disposed on the bottom surface of the display panel DP corresponding to a second region AA2 and may support the display panel DP.

In an embodiment, the second support layer PL2 may be coupled to the bottom surface of the display panel DP through a planar adhesive layer AL. The planar adhesive layer AL may include a transparent adhesive, such as an optically clear adhesive ("OCA") film, an optically clear resin ("OCR"), or a pressure sensitive adhesive ("PSA") film. However, the type of adhesive contained in the planar adhesive layer AL is not limited thereto. Also, unlike the embodiment illustrated in FIG. 6, the planar adhesive layer AL may be omitted.

Here, FIG. 6 illustrates that the thickness of the second support layer PL2 is greater than the thickness of the cover member CV. However, this is merely an example, and the thickness of the second support layer PL2 may be less than the thickness of the cover member CV in another embodiment. Also, FIG. 6 illustrates, as an example, that the second support layer PL2 has a single-layer structure. However, the embodiment is not limited thereto, and the second support layer PL2 may include a plurality of different components in another embodiment. In an embodiment, for example, the second support layer PL2 may include a plurality of different components selected from among a metal plate, a heat dissipation layer, an electromagnetic shielding layer, a cushion layer, and a digitizer.

The cover member CV may overlap the first region AA1 and may be coupled to the bottom surface of the display panel DP in a plan view. The cover member CV may be spaced apart from the second support layer PL2 in the first direction DR1. However, the embodiment is not limited thereto, and the cover member CV and the second support layer PL2 may be in contact with each other in another embodiment. That is, a gap is not defined between the cover member CV and the second support layer PL2, and one side surface of the cover member CV and one side surface of the second support layer PL2 may be in contact with each other.

The cover member CV includes a cover layer CVL. The cover member CV may further include adhesive layers PSA1 and PSA2 disposed on at least one surface of the cover layer CVL.

The cover layer CVL may be a layer including a polymer material having the flexibility described above. The cover layer CVL includes a material having elasticity and may support the first region AA1 of the display panel DP folded at a certain curvature, thereby relieving stress caused by folding. In addition, the cover layer CVL may prevent foreign substances from entering the display panel DP through openings OP that are defined in the first support layer PL1 disposed below the cover layer CVL. The cover layer CVL may include a material having a low modulus, and thus, stress applied when the display device DD operates in the first mode and the second mode may be reduced.

The cover layer CVL includes an upper surface CVL-U adjacent to the display panel DP and a lower surface CVL-L adjacent to the first support layer PL1, and the adhesive layers PSA1 and PSA2 may be disposed on at least one of the upper surface CVL-U or the lower surface CVL-L. In the display device DD according to an embodiment, the cover member CV may include the first adhesive layer PSA1 disposed on the upper surface CVL-U of the cover layer CVL and a second adhesive layer PSA2 disposed on the lower surface CVL-L of the cover layer CVL. The upper surface CVL-U of the cover layer CVL may be in contact with the first adhesive layer PSA1, and the lower surface CVL-L of the cover layer CVL may be in contact with the second adhesive layer PSA2. The display panel DP may be bonded to the cover layer CVL by the first adhesive layer PSA1, and the first support layer PL1 may be bonded to the cover layer CVL by the second adhesive layer PSA2. Also, the second adhesive layer PSA2 may be omitted, and in this case, the cover layer CVL and the first support layer PL1 may be in direct contact with each other.

When viewed in the second direction DR2 parallel to a direction in which the support bars SB extend, the cross-section of the support bars SB may have a rectangular shape. That is, the upper surface of each of the support bars SB, which faces the display panel DP, may have substantially the same area as the bottom surface corresponding thereto. However, this is merely illustrated as an example, and each of the support bars SB may include an upper surface having an area smaller than an area of the bottom surface. In an embodiment, for example, the cross-section of each of the support bars SB may have various shapes, such as an inverted triangle or an inverted trapezoid.

A window WP may be disposed on the display panel DP. The window WP may include a window substrate WB in which a plurality of groove patterns GVP are defined, fillers FL which fill the plurality of groove patterns GVP, respectively, and a window cover layer CWL disposed on the window substrate WB.

The window substrate WB may include an optically transparent material. In an embodiment, for example, the window substrate WB may include a glass substrate, and the glass substrate may be a chemically strengthened tempered glass substrate. The window substrate WB may include a glass substrate and provide excellent aesthetics. In addition, it is possible to prevent dents or scratches caused by sharp materials.

The window substrate WB may include an upper surface WB-U and a lower surface WB-B that are opposed to each other. In an embodiment, the upper surface WB-U and the lower surface WB-B may face each other in the third direction DR3. The window substrate WB may have a certain thickness in the third direction DR3. The thickness of the window substrate WB may affect impact resistance of the window substrate WB. When the thickness of the window substrate WB is too small, the window substrate WB may be broken or damaged by an impact concentrated on a local region (e.g., an impact by a pen drop). When the thickness of the window substrate WB is too large, the flexibility may be deteriorated or the window substrate WB may be broken during folding. In an embodiment, for example, the thickness of the window substrate WB may be about 100 micrometers ($\mu$m) to about 1000 $\mu$m. The thickness of the window substrate WB may be about 200 $\mu$m.

However, the thickness of the window substrate WB is not necessarily limited to the examples of numerical values described above. When the thickness of the window substrate WB satisfies the above numerical range, the impact resistance of the window substrate WB is secured. Accordingly, the display panel DP to be disposed below the window substrate WB may be protected from external impact.

The window substrate WB may include a bending portion BP corresponding to the first region AA1 and a non-bending portion NBP corresponding to the second region AA2. Referring to FIG. 2A together, the bending portion BP may be a part that is folded about the rotation axis FX extending in the second direction DR2. Specifically, a portion of the bending portion BP is bent in the first mode such that an end thereof spaced apart from the non-bending portion NBP overlaps the non-bending portion NBP in the third direction DR3. In the first mode, at least a portion of the bending portion BP may not be exposed to the outside. The non-bending portion NBP is parallel to the first and second directions DR1 and DR2 and may be provided as a planar portion.

According to an embodiment of the invention, the plurality of groove patterns GVP may be defined in the bending portion BP. The plurality of groove patterns GVP may extend in the second direction DR2 and may be arranged in the first direction DR1. The plurality of groove patterns GVP may not overlap each other in the third direction DR3 that is the thickness direction.

FIG. 6 illustrates, as an example, 11 groove patterns GVP that are recessed in the bending portion BP in the third direction DR3 or in a direction opposite to the third direction DR3. However, the number of groove patterns GVP is not limited to that illustrated.

The non-bending portion NBP may be adjacent to the bending portion BP. The plurality of groove patterns GVP may not be defined in the non-bending portion NBP.

The bending portion BP may include the plurality of groove patterns GVP, and thus, the folding characteristics may be improved compared to the non-bending portion NBP. Specifically, the bending portion BP includes the plurality of groove patterns GVP, and thus, the thickness of a portion of the bending portion BP may be relatively smaller than the thickness of the non-bending portion NBP to improve flexibility. Accordingly, stress applied to the window substrate WB when the display device DD is folded may be reduced, and damage caused by folding of the window substrate WB may be prevented.

According to an embodiment of the invention, the filler FL may fill each of the plurality of groove patterns GVP. Specifically, the fillers FL may be provided in contact with the bottom and side surfaces of the plurality of groove patterns GVP and completely fill the inside of the plurality of groove patterns GVP. The shape of the filler FL may correspond to the shape of each of the plurality of groove patterns GVP. The fillers FL may absorb external impact by filling the inner spaces provided by the plurality of groove patterns GVP and may also supplement the impact resistance of the window WP within the first region AA1.

The filler FL may include an elastic material. The filler FL may include an organic material. In an embodiment, for example, the filler FL may include a resin having elasticity. The fillers FL may prevent the window WP from being deformed due to compressive or tensile stress applied during folding, while maintaining improved folding characteristics of the window WP.

The fillers FL may include an optically transparent material. As the fillers FL include a transparent material, it is possible to prevent the plurality of groove patterns GVP from being recognized outside the display surface DS (see FIG. 1A) of the display module DM (see FIG. 1A) that overlaps the first region AA1 of the window WP in a plan view.

The window cover layer CWL may be disposed on the window substrate WB. The upper surface of the window cover layer CWL may be parallel to a plane defined by the first and second directions DR1 and DR2. Substantially, the upper surface of the window cover layer CWL may define the display surface DS illustrate in FIG. 1A.

The window cover layer CWL may have optically transparent characteristics. In an embodiment, for example, the window cover layer CWL may include materials, such as transparent glass, polymethylmethacrylate ("PMMA"), and polycarbonate PC. However, the material of the window cover layer CWL is not limited to those described above.

The window cover layer CWL may include a chemically reinforced glass substrate. In an embodiment, for example, the window cover layer CWL may include ultra-thin glass ("UTG"). The window cover layer CWL is chemically reinforced and thus may have excellent mechanical strength while having high flexibility. As the window cover layer CWL has the excellent mechanical strength, the window substrate WB or the display panel DP may be protected from external impact.

Figure 7A:
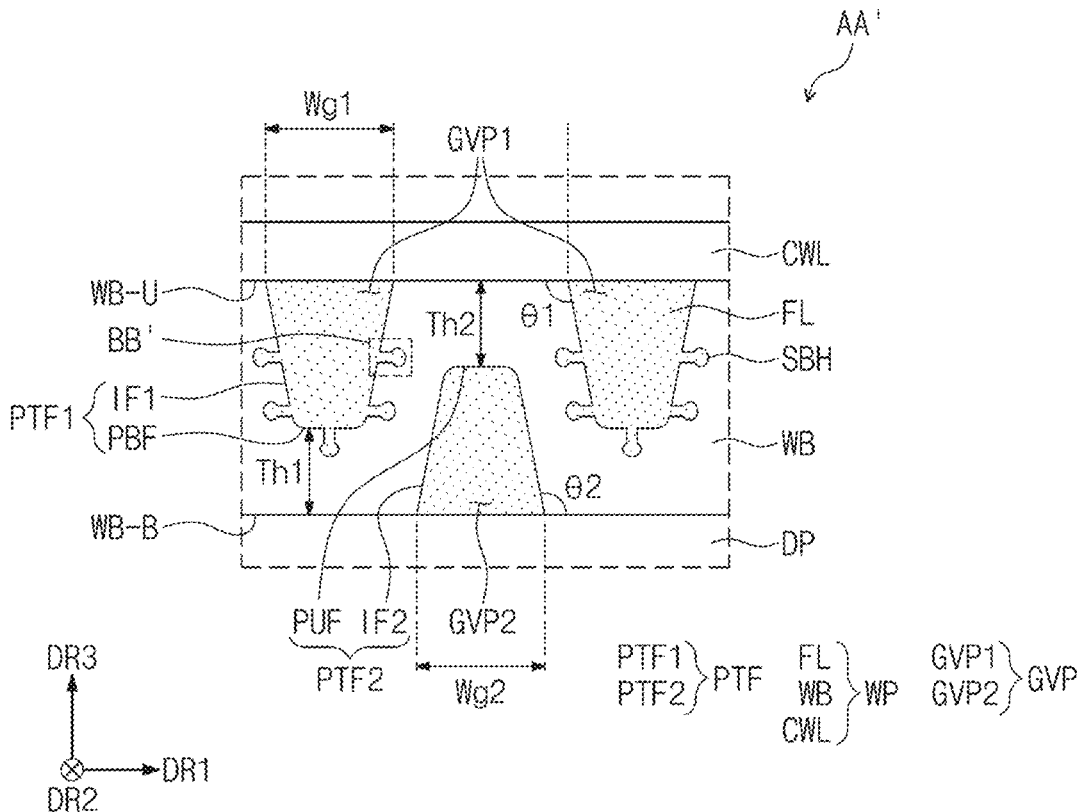
FIG. 7A is an enlarged view of a region AA' of FIG. 6.
Figure 7B:
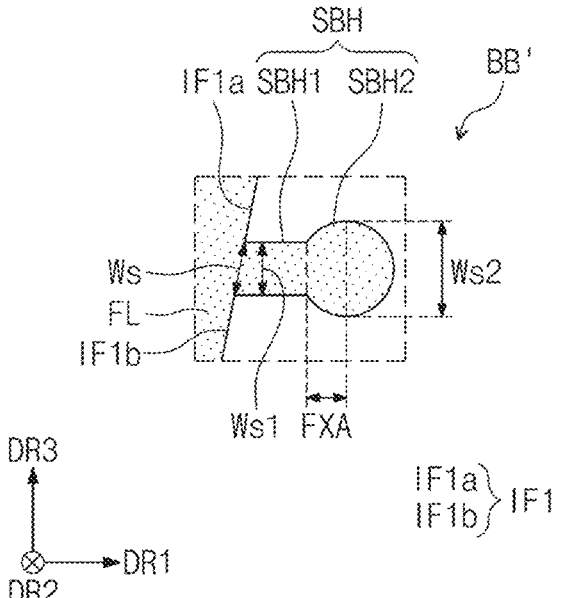
FIG. 7B is an enlarged view of a region BB' of FIG. 7A.

FIG. 7A is an enlarged view of a region AA' of FIG. 6. FIG. 7B is an enlarged view of a region BB' of FIG. 7A.

Referring to FIG. 7A, the plurality of groove patterns GVP may include first groove patterns GVP1 (or upper groove patterns) and second groove patterns GVP2 (or lower groove patterns). Each of the first groove patterns GVP1 is recessed from the upper surface WB-U of the window substrate WB toward the lower surface WB-B of the window substrate WB. Each of the second groove patterns GVP2 is recessed from the lower surface WB-B of the window substrate WB toward the upper surface WB-U of the window substrate WB.

The plurality of groove patterns GVP may be defined by pattern surfaces PTF which are connected to the upper surface WB-U of the window substrate WB or the lower surface WB-B of the window substrate WB. Specifically, the first groove pattern GVP1 may be defined by a first pattern surface PTF1 connected to the upper surface WB-U of the window substrate WB, and the second groove pattern GVP2 may be defined by the second pattern surface PTF2 connected to the lower surface WB-B of the window substrate WB. The upper surface WB-U of the window substrate WB may be divided into two sections by the first groove pattern GVP1. The lower surface WB-B of the window substrate WB may be divided into two sections by the second groove pattern GVP2.

FIG. 7A illustrates that the first pattern surface PTF1 includes two first side surfaces IF1 extending from two sections of the upper surface WB-U, respectively, and a pattern lower surface PBF extending from the two first side surfaces IF1 as an example. The pattern lower surface PBF may be recessed from the upper surface WB-U and parallel to the upper surface WB-U. The pattern lower surface PBF may provide a substantially flat surface. In the cross-section, a first thickness Th1 from the lower surface WB-B of the window substrate WB to the pattern lower surface PBF of the first groove pattern GVP1 may be smaller than a thickness from the upper surface WB-U of the window substrate WB to the pattern lower surface PBF. The first thickness Th1 from the lower surface WB-B of the window substrate WB to the pattern lower surface PBF may be about 40 μm to about 60 μm. A portion of the window substrate WB overlapping the first groove pattern GVP1 has a relatively small thickness in a plan view, and thus, the window WP (see FIG. 6) may have improved folding characteristics.

The two first side surfaces IF1 may be bent from two sections of the upper surface WB-U, respectively. The two first side surfaces IF1 and the pattern lower surface PBF may be integrated with each other. Each of the two first side surfaces IF1 may include an inclined surface extending from the upper surface WB-U and at least one curved surface. In an embodiment, for example, the first side surface IF1 may have the curved surface that is bent from the pattern lower surface PBF and has a certain curvature. As the first side surface IF1 includes the curved surface, stress is prevented from being locally concentrated on the lower portion of the window WP during folding. Accordingly, it is possible to prevent the window WP from being damaged by repeated folding operations. The two first side surfaces IF1 may be symmetrical to each other on the basis of the pattern lower surface PBF. A width Wg1 of the first groove pattern GVP1 may be equal to a distance between the two first side surfaces IF1. Specifically, the width Wg1 of the first groove pattern GVP1 may be equal to the distance between the two sections of the upper surface WB-U spaced apart from each other by the first groove pattern GVP1 therebetween. In an embodiment, for example, the width Wg1 of the first groove pattern GVP1 may be about 50 μm to about 200 μm.

The second pattern surface PTF2 may include second side surfaces IF2 extending from the lower surface WB-B and a pattern upper surface PUF extending from the second side surfaces IF2. The pattern upper surface PUF may be recessed from the lower surface WB-B and parallel to the lower surface WB-B. The pattern upper surface PUF may provide a substantially flat surface. In the cross-section, a second thickness Th2 from the upper surface WB-U of the window substrate WB to the pattern upper surface PUF of the second groove pattern GVP2 may be smaller than a thickness from the lower surface WB-B of the window substrate WB to the pattern upper surface PUF. The first thickness Th1 from the lower surface WB-B of the window substrate WB to the pattern lower surface PBF may be substantially the same as the second thickness Th2 from the upper surface WB-U of the window substrate WB to the pattern upper surface PUF. The second thickness Th2 from the upper surface WB-U of the window substrate WB to the pattern upper surface PUF may be about 40 μm to about 60 μm. A portion of the window substrate WB overlapping the second groove pattern GVP2 has a relatively small thickness in a plan view, and thus, the window WP may have improved folding characteristics.

The second side surfaces IF2 may be bent from the lower surface WB-B. The second side surfaces IF2 and the pattern upper surface PUF may be integrated with each other. Each of the second side surfaces IF2 may include a flat surface extending from the lower surface WB-B and at least one curved surface. In an embodiment, for example, the second side surface IF2 may have the curved surface that is bent from the pattern upper surface PUF and has a certain curvature. As the second side surface IF2 includes the curved surface, stress is prevented from being locally concentrated on the lower portion of the window WP during folding. Accordingly, it is possible to prevent the window WP from being damaged by repeated folding operations. The second side surfaces IF2 may be symmetrical to each other on the basis of the pattern upper surface PUF. A width Wg2 of the second groove pattern GVP2 may be equal to a distance between the second side surfaces IF2. Specifically, the width Wg2 of the second groove pattern GVP2 may be equal to the distance between sections of the lower surface WB-B spaced apart from each other with the second groove pattern GVP2 therebetween. In an embodiment, for example, the width Wg2 of the second groove pattern GVP2 may be about 50 μm to about 200 μm.

The pitch of the plurality of first groove patterns GVP1 may be the same as the pitch of the plurality of second groove patterns GVP2. In an embodiment, for example, the pitch of each of the plurality of first groove patterns GVP1 and the plurality of second groove patterns GVP2 may be about 150 μm to about 250 μm.

As illustrated in FIG. 7A, a first angle θ1 between the upper surface WB-U of the window substrate WB and the first side surface IF1 and a second angle θ2 between the lower surface WB-B of the window substrate WB and the second side surface IF2 may have a value close to about 90°. In an embodiment, for example, each of the first angle θ1 and the second angle θ2 may be about 97.9°.

According to an embodiment of the invention, a sub groove SBH may be provided in least one of the plurality of groove patterns GVP. The sub groove SBH recessed into the window substrate WB may be provided in each of the plurality of groove patterns GVP. Specifically, the first groove pattern GVP1 may be provided with a sub groove SBH which is recessed from the first pattern surface PTF1 to the inside of the window substrate WB. A plurality of sub grooves SBH may be provided. As illustrated in the drawing, four sub grooves SBH may be provided in the first side surfaces IF1 and one sub groove SBH may be provided in the pattern lower surface PBF. However, the number of sub grooves SBH is not limited thereto. For another example, the number of sub grooves SBH provided in each of the plurality of first groove patterns GVP1 may be variously set in a range of at least one or more. Although not illustrated, the sub grooves SBH may be provided in the second groove patterns GVP2 according to the direction in which the window substrate WB is folded.

The first groove patterns GVP1, the sub grooves SBH, and the second groove patterns GVP2 may be filled with the fillers FL. The fillers FL may completely fill the inner spaces of the first groove patterns GVP1 and the sub grooves SBH. The shapes of the fillers FL may correspond to the shapes of the first groove patterns GVP1 and the sub grooves SBH.

Referring to FIG. 7B together, each of the sub grooves SBH may include a first sub groove SBH1 and a second sub groove SBH2 extending from the first sub groove SBH1 to the inside of the window substrate WB.

A width Ws1 of the first sub groove SBH1 may be similar to a distance Ws between the two segments of the first side surface IF1 spaced apart from each other with the first sub groove SBH1 therebetween. Specifically, the first side surface IF1 includes two first side surfaces IF1a and IF1b divided by the first sub groove SBH1, and the width Ws1 of the first sub groove SBH1 may be similar to the distance Ws between the two first side surfaces IF1a and IF1b spaced apart from each other with the first sub groove SBH1 therebetween. According to an embodiment of the invention, the width Ws1 of the first sub groove SBH1 may be constant in a direction toward the inside of the window substrate WB. However, the embodiment is not limited thereto, and the width Ws1 of the first sub groove SBH1 may increase in the direction toward the inside of the window substrate WB in another embodiment.

The cross-section of the second sub groove SBH2 may have a circular shape. A maximum width Ws2 of the second sub groove SBH2 may be defined as the maximum diameter of the second sub groove SBH2 in a cross-sectional view. That is, as the cross-section of the second sub groove SBH2 has a circular shape, the maximum width Ws2 of the second sub groove SBH2 may be equal to the diameter of the circle. According to an embodiment of the invention, the maximum width Ws2 of the second sub groove SBH2 may be greater than the width Ws1 of the first sub groove SBH1. In an embodiment, for example, the width Ws1 of the first sub groove SBH1 may be about 5 μm to about 10 μm, and the maximum width Ws2 of the second sub groove SBH2 may be about 15 μm to about 20 μm.

According to an embodiment of the invention, the sub groove SBH may include a region (i.e., defined as a fixing region FXA) in which the width of the sub groove SBH increases gradually in a direction in which the sub groove SBH is recessed. As an example of the invention, the fixing region FXA may be provided in the second sub groove SBH2. The sub groove SBH may have an anchor shape by the first and second sub grooves SBH1 and SBH2. As the sub groove SBH includes the fixing region FXA in which the width of the sub groove SBH gradually increases, the filler FL located in the sub groove SBH may be fixed to the sub groove SBH even when subjected to tensile stress.

Referring to FIGS. 2A, 6, 7A, and 7B, the sub grooves SBH recessed into the window substrate WB may be provided in each of the plurality of groove patterns GVP, and the fillers FL may fill the groove patterns GVP and the sub grooves SBH. When the window WP according to an embodiment of the invention is folded about a folding axis FX, the filler FL provided in each of the plurality of groove patterns GVP may be subjected to compressive stress or tensile stress. Specifically, when the sub groove SBH is not provided, the filler FL in the first groove pattern GVP1 may be subjected to tensile stress, when the window is folded, and then separated from the first side surface IF1. That is, a gap may occur between the filler FL and the first side surface IF1. When the display device displays an image in the second mode, light is refracted or reflected by the gap between the filler FL and the first side surface IF1, and this light may be emitted from the display surface DS and viewed. According to an embodiment of the invention, the sub grooves SBH recessed into the inside of the window substrate WB are additionally provided in each of the plurality of groove patterns GVP, and each of the sub grooves SBH may be completely filled with the filler FL. The maximum width Ws2 of the second sub groove SBH2 in the sub groove SBH may be greater than the width Ws1 of the first sub groove SBH1. Accordingly, even when the filler FL in the first groove pattern GVP1 is subjected to tensile stress, the filler FL filling the sub groove SBH is attracted in a direction opposite to the tensile stress by the width Ws1 of the first sub groove SBH1 having a relatively small width. Accordingly, the tensile stress is offset by the attractive force, and thus, the filler FL may remain attached to the first side surface IF1. That is, no gap is generated between the filler FL and the first side surface IF1. Therefore, it is possible to prevent light generated from the display surface DS of the display module DM overlapping the first region AA1 of the window WP from being viewed, and thus, a reliable display device DD may be provided.

Figure 8:
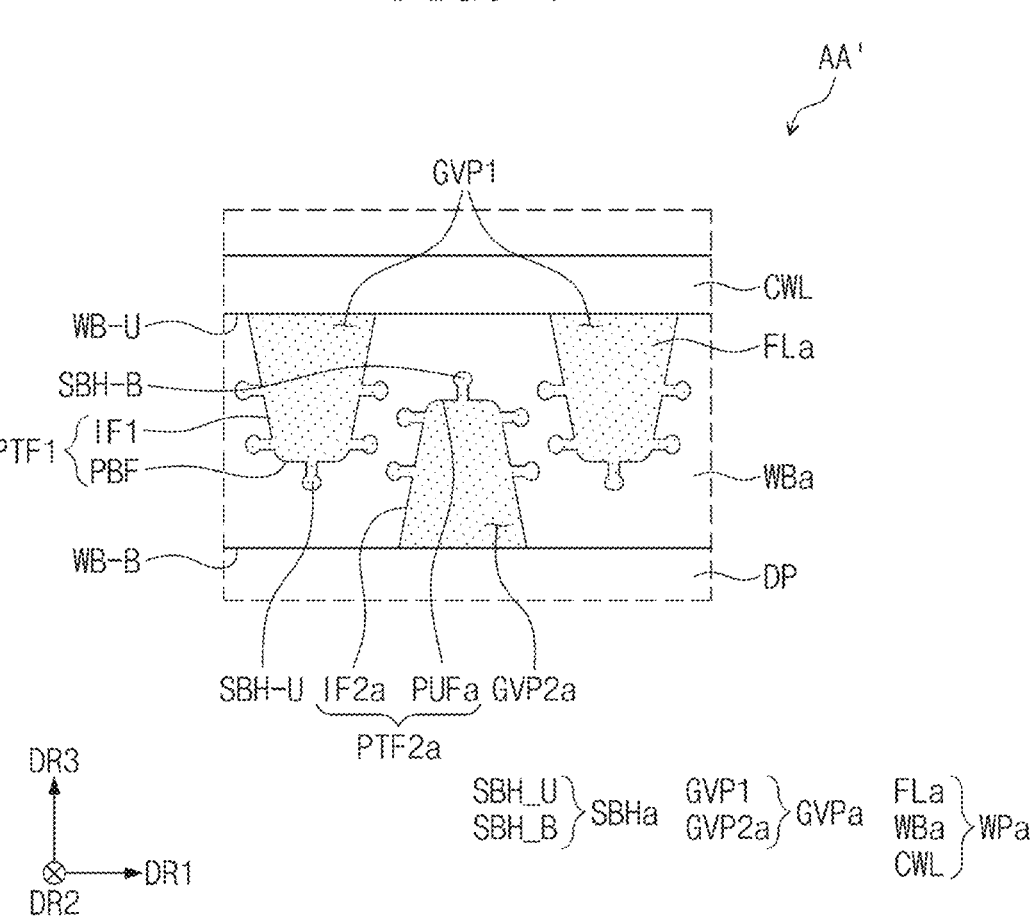
FIG. 8 is an enlarged view of a portion of a window according to another embodiment of the invention.

FIG. 8 is an enlarged view of a portion of a window according to another embodiment of the invention.

Referring to FIG. 8, a sub groove SBHa recessed into the window substrate WBa may be provided in each of a plurality of groove patterns GVPa. The plurality of groove patterns GVPa may include a first groove pattern GVP1 that is recessed from an upper surface WB-U of the window substrate WBa toward a lower surface WB-B of the window substrate WBa and a second groove pattern GVP2a that is recessed from the lower surface WB-B of the window substrate WBa toward the upper surface WB-U of the window substrate WBa.

The first groove pattern GVP1 may be provided with an upper sub groove SBH-U which is recessed from a first pattern surface PTF1 to the inside of the window substrate WBa. As illustrated in the drawing, four upper sub grooves SBH-U may be provided in first side surfaces IF1 and one upper sub groove SBH-U may be provided in a pattern lower surface PBF. However, the number of upper sub grooves SBH-U is not limited thereto. For another example, the number of upper sub grooves SBH-U provided in each of the plurality of first groove patterns GVP1 may be variously set in a range of at least one or more. The first groove patterns GVP1 and the upper sub grooves SBH-U may be filled with fillers FLa. The fillers FLa may completely fill the inner spaces of the first groove patterns GVP1 and the upper sub grooves SBH-U.

The second groove pattern GVP2a may be provided with a lower sub groove SBH-B which is recessed from a second pattern surface PTF2a to the inside of the window substrate WBa compared to the embodiment of FIG. 7A. As illustrated in the drawing, four lower sub grooves SBH-B may be provided in second side surfaces IF2a and one lower sub groove SBH-B may be provided in a pattern upper surface PUFa. However, the number of lower sub grooves SBH-B is not limited thereto. For another example, the number of lower sub grooves SBH-B provided in each of the plurality of second groove patterns GVP2a may be variously set in a range of at least one or more. The second groove patterns GVP2a and the lower sub grooves SBH-B may be filled with the fillers FLa. The fillers FLa may completely fill the inner spaces of the second groove patterns GVP2a and the lower sub grooves SBH-B.

Referring to FIG. 2A together, as the lower sub groove SBH-B are provided in the second groove patterns GVP2a, when the window WPa according to an embodiment of the invention is folded as shown in FIG. 2A or folded in a direction opposite to that shown in FIG. 2A, even though the fillers FLa in the upper sub grooves SBH-U or the lower sub grooves SBH-B are subjected to tensile stress, the fillers FLa are attracted in the opposite direction to the tensile stress by the upper sub grooves SBH-U or the lower sub grooves SBH-B and thus may remain attached to the first side surfaces IF1 and the second side surfaces IF2a.

Figure 9A:
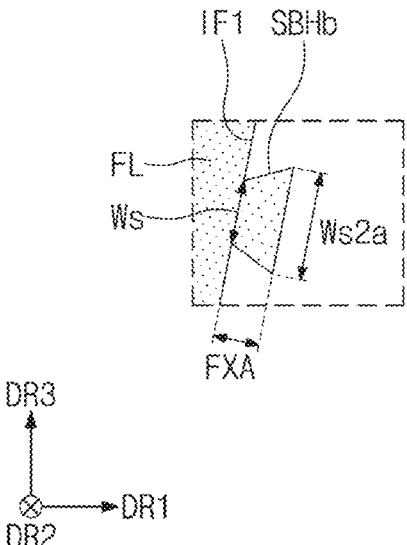
FIG. 9A is a view showing a sub groove according to another embodiment of the invention.
Figure 9B:
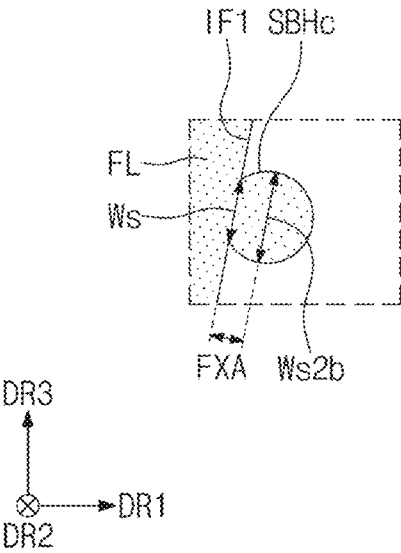
FIG. 9B is a view showing a sub groove according to still another embodiment of the invention.

FIGS. 9A and 9B are views showing a sub groove according to embodiments of the invention.

Referring to FIG. 9A, the width of a sub groove SBHb may increase toward the inside of the window substrate WB from the filler FL (see FIG. 7A). A maximum width Ws2a adjacent to the inside of the window substrate WB may be defined in the sub groove SBHb, and the maximum width Ws2a may increase toward the inside of the window substrate WB. That is, as described with reference to FIG. 7B, the sub groove SBHb may include a fixing region FXA in which the width of the sub groove SBHb increases gradually in the direction in which the sub groove SBHb is recessed. The maximum width Ws2a may be greater than a distance Ws between the two sections of a first side surface IF1 spaced apart from each other by the sub groove SBHb therebetween. The distance Ws between the two sections of the first side surface IF1 may be about 5 μm to about 10 μm, and the maximum width Ws2a may be about 15 μm to about 20 μm.

Referring to FIG. 9B, the cross-section of a sub groove SBHc may have a circular shape. A maximum width Ws2$b$ of the sub groove SBHc may be defined as the diameter of the sub groove SBHc. That is, as the sub groove SBHc has a circular shape, the maximum width Ws2$b$ of the sub groove SBHc may be equal to the diameter of the circle. As described with reference to FIG. 7B, the sub groove SBHc may include a fixing region FXA in which the width of the sub groove SBHc increases gradually in the direction in which the sub groove SBHc is recessed. The inner maximum width Ws2$b$ of the sub groove SBHc may be greater than a distance Ws between the two sections of a first side surface IF1 spaced apart from each other by the sub groove SBHc therebetween. In an embodiment, for example, the distance Ws between the two sections of the first side surface IF1 may be about 5 μm to about 10 μm, and the maximum width Ws2$b$ of the sub groove SBHc may be about 15 μm to about 20 μm.

Figure 10A:
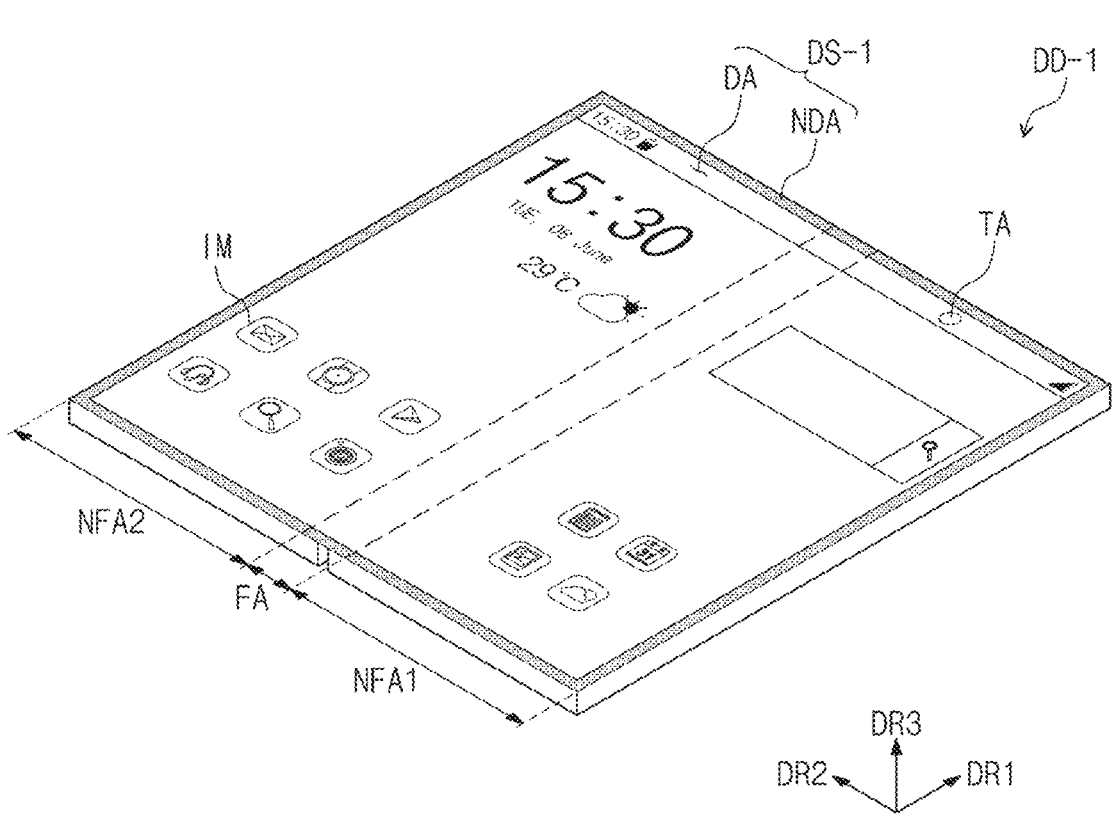
FIG. 10A is a perspective view of a display device according to another embodiment of the invention.
Figure 10B:
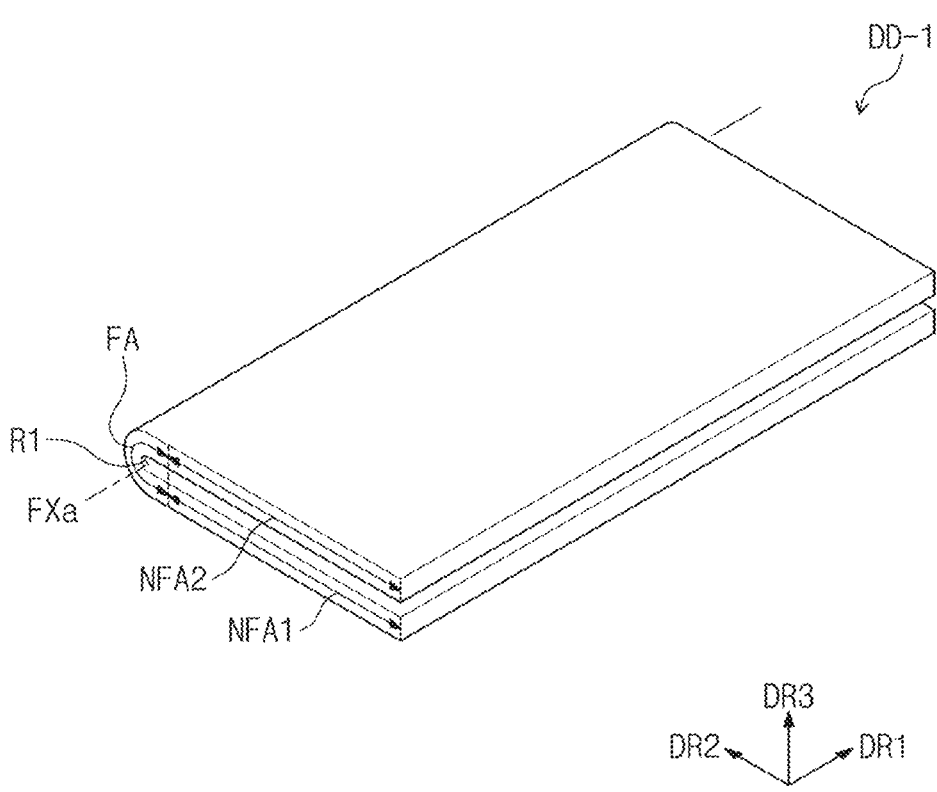
FIG. 10B is a perspective view of the display device according to another embodiment of the invention.
Figure 10C:
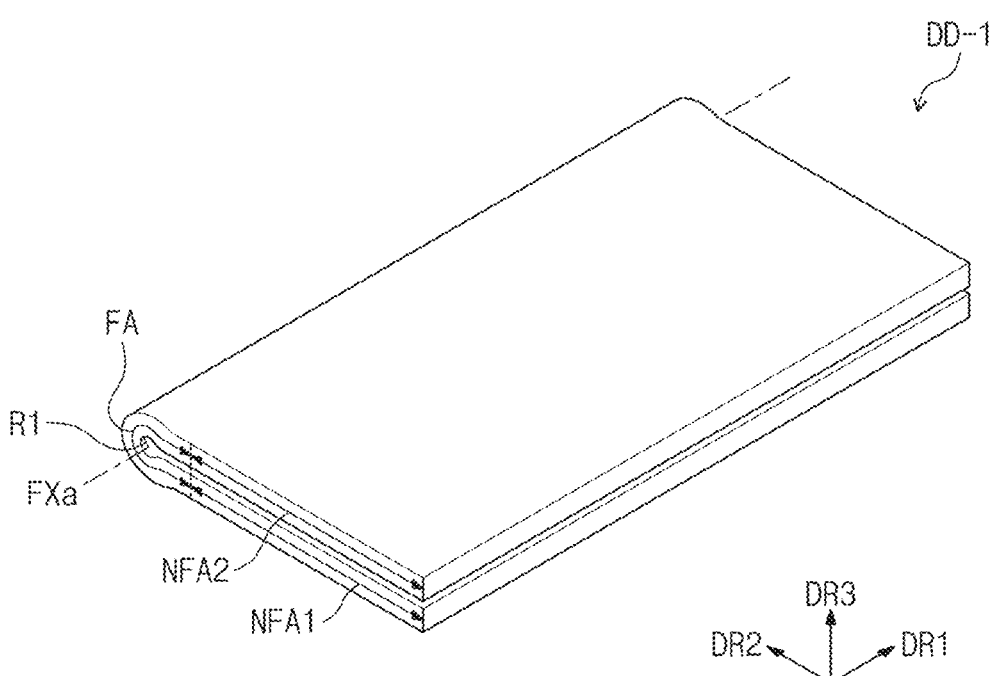
FIG. 10C is a perspective view of the display device according to another embodiment of the invention.

FIGS. 10A to 10C are perspective views of a display device according to another embodiment of the invention. FIG. 10A illustrates a state in which a display device DD-1 is unfolded, and FIGS. 10B and 10C illustrate a state in which the display device DD-1 is folded. FIGS. 10A to 10C illustrate the display device DD-1 according to another embodiment different from the display device DD illustrated in FIGS. 1A to 3.

Referring to FIGS. 10A to 10C, the display device DD-1 according to an embodiment of the invention may include a display surface DS-1 defined by a first direction DR1 and a second direction DR2 crossing the first direction DR1. The display device DD-1 may provide a user with an image IM via the display surface DS-1.

The display surface DS-1 may include a display region DA and a non-display region NDA around the display region DA. The display region DA may display the image IM, but the non-display region NDA may not display the image IM. The non-display region NDA may surround the display region DA. However, the embodiment of the invention is not limited thereto, and the shape of the display region DA and the shape of the non-display region NDA may be changed.

The display surface DS-1 may include a sensing region TA. The sensing region TA may include a portion of the display region DA. The sensing region TA has higher transmittance than other regions of the display area DA. Hereinafter, the other regions of the display region DA except for the sensing region TA may be defined as a general display region.

An optical signal, for example, visible light or infrared light, may move via the sensing region TA. The display device DD-1 may capture an external image using the visible light passing through the sensing region TA or determine whether an external object is approaching using the infrared light. FIG. 10A illustrates one sensing region TA as an example, but the embodiment is not limited thereto. A plurality of sensing regions TA may be provided in another embodiment.

The display device DD-1 may include a folding region FA (or a bending region) and a plurality of non-folding regions NFA1 and NFA2 (non-bending regions). The non-folding region NFA1 and NFA2 may include a first non-folding region NFA1 (or a first non-bending region) and a second non-folding region NFA2 (or a second non-bending region). In the second direction DR2, the folding region FA may be located between the first non-folding region NFA1 and the second non-folding region NFA2.

As illustrated in FIG. 10B, the folding region FA may be folded about a folding axis FXa parallel to the first direction DR1. The folding region FA may have certain curvature and a certain radius R1 of curvature. The display device DD-1 may be in-folded so that the first non-folding region NFA1 and the second non-folding region NFA2 face each other and the display surface DS-1 is not exposed to the outside.

Although not illustrated, the display device DD-1 may be out-folded so that the display surface DS-1 is exposed to the outside. In an embodiment of the invention, the display device DD-1 may be configured such that an in-folding operation or an out-folding operation are repeated by an unfolding operation. However, the embodiment is not limited thereto. In another embodiment of the invention, the display device DD-1 may be configured to select any one of the unfolding operation, the in-folding operation, and the out-folding operation.

As shown in FIG. 10B, the distance between the first non-folding region NFA1 and the second non-folding region NFA2 may be substantially the same as the radius of curvature R1. On the other hand, as shown in FIG. 10C, the distance between the first non-folding region NFA1 and the second non-folding region NFA2 may be less than the radius of curvature R1.

According to an embodiment of the invention, the groove patterns GVP, the sub grooves SBH, and the fillers FL shown in FIG. 7A may be provided in a region overlapping the folding region FA. Therefore, it is possible to prevent light generated from the display surface DS-1 from being viewed as described above, and thus, the reliable display device DD-1 may be provided.

FIGS. 11A to 11G are cross-sectional views illustrating each of operations in a method for manufacturing a window according to an embodiment of the invention.

Figures 11A, 11B:
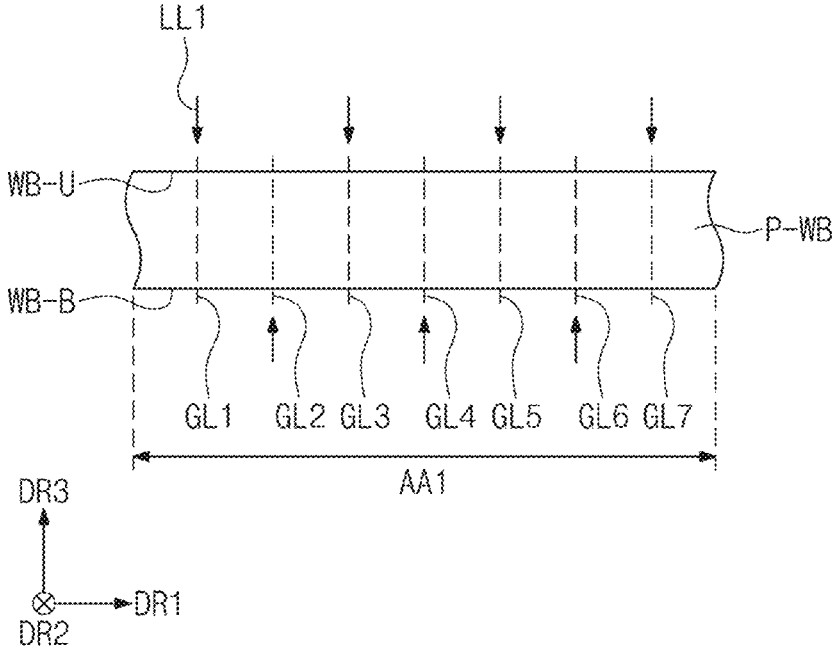
FIGS. 11A to 11G are cross-sectional views illustrating each of operations in a method for manufacturing a window according to an embodiment of the invention.

Referring to FIG. 11A, a preliminary window substrate P-WB may be provided. The preliminary window substrate P-WB may include an upper surface WB-U and a lower surface WB-B and may have a thickness parallel to a third direction DR3. The preliminary window substrate P-WB illustrated in FIG. 11A may include a region that corresponds to the first region AA1 shown in FIG. 6. A region overlapping the first region AA1 in a plan view may be a folded region.

Figure 11C:
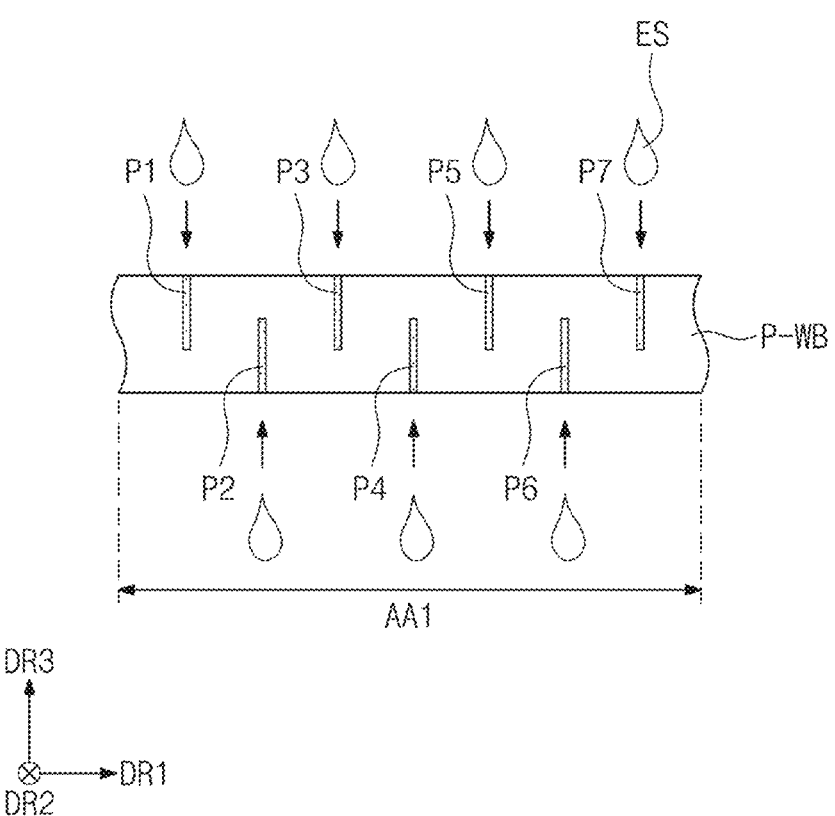
Figure 11D:
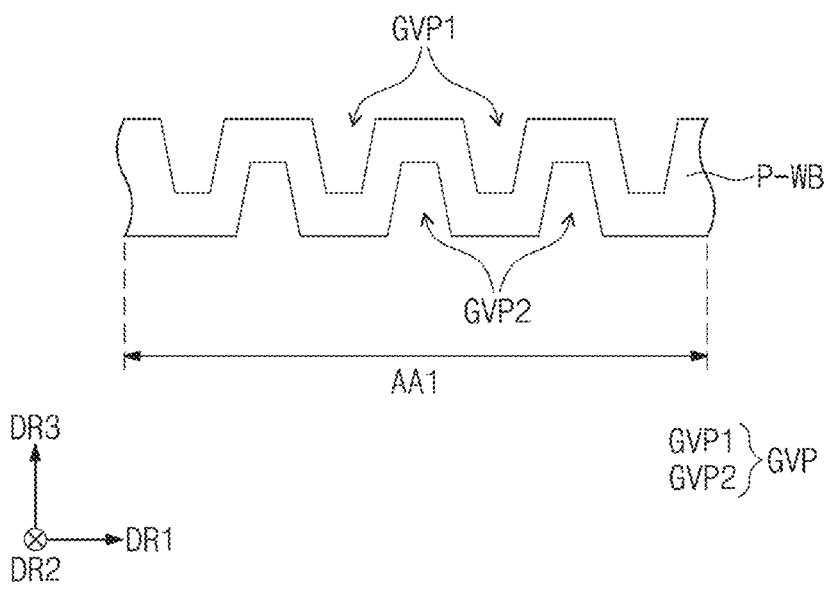

Referring to FIGS. 11B to 11D, a groove pattern GVP is formed on the preliminary window substrate P-WB.

Referring to FIG. 11B, virtual lines GL1 to GL7 for forming a plurality of groove patterns GVP (see FIG. 11D) may be defined in the first region AA1 of the preliminary window substrate P-WB. The lines GL1 to GL7 may correspond to formation positions at which the plurality of groove patterns GVP are to be formed and may be defined parallel to a direction in which the plurality of groove patterns GVP to be formed are recessed.

First laser beams LL1 may be emitted from above/below the preliminary window substrate P-WB in a thickness direction of the preliminary window substrate P-WB. The first laser beams LL1 may be emitted onto a plurality of points to overlap the lines GL1 to GL7 in a plan view.

The points irradiated with the first laser beams LL1 may change in phase while local melting occurs due to the first laser beams LL1. Accordingly, the preliminary window substrate P-WB may change in refractive index. The refractive indexes of the points irradiated with the first laser beams LL1 may be different from the refractive indexes of the preliminary window substrate P-WB before irradiated with the first laser beams LL1. Each of the first laser beams LL1 may have an intensity sufficient to change the refractive index of a portion of the preliminary window substrate P-WB without cutting the portion of the preliminary window substrate P-WB.

The first laser beam LL1 may have pulse energy. A pulse duration of the first laser beam LL1 may have a range from hundreds of picoseconds to tens of femtoseconds. In an embodiment, for example, the pulse duration of the first laser beam LL1 may be about 200 picoseconds or less. The pulse duration of the first laser beam LL1 may vary according to the material or thickness of the preliminary window substrate P-WB. The wavelength of the first laser beam LL1 may be about 250 nm to 1500 nm, specifically, about 340 nm to 1060 nm.

The first laser beams LL1 may have non-diffractive beams. In an embodiment, for example, the first laser beams LL1 may include Bessel beams. However, the embodiment is not limited thereto, and the first laser beams LL1 may include Gaussian beams in another embodiment.

FIG. 11C is a cross-sectional view of the preliminary window substrate P-WB after irradiated with the first laser beams LL1. For convenience of description, portions P1 to P7 irradiated with the first laser beams LL1 are shown as hatched regions, but the portions P1 to P7 irradiated with the first laser beams LL1 may be minute and thus substantially difficult to identify with the naked eyes. The refractive indexes of the portions P1 to P7 after irradiated with the laser beams may be different from the refractive indexes of the preliminary window substrate P-WB which has not been irradiated with the laser beams.

Each of the portions P1 to P7 may have a certain width in a plan view. In an embodiment, for example, each of the portions P1 to P7 may have a width of about 3 μm or less. The first laser beams LL1 change the refractive indexes without forming physical holes in the preliminary window substrate P-WB, and the portions at which the refractive indexes are changed are small in size. Accordingly, a change in appearance of the preliminary window substrate P-WB by the first laser beams LL1 may not be easily recognized and may be recognized using a high-magnification microscope or the like.

Each of the portions P1 to P7 may be spaced apart from each other at certain intervals in a first direction DR1. The intervals between the portions P1 to P7 may be equal to each other. The intervals between the plurality of groove patterns GVP to be formed may vary according to the intervals between the portions P1 to P7.

Referring to FIG. 11C, the portions P1 to P7 may be etched using an etching solution ES. Specifically, the etching solution ES may be provided to the first portion P1, the third portion P3, the fifth portion P5, and the seventh portion P7 on the upper surface WB-U of the preliminary window substrate P-WB. The etching solution ES may be supplied to the second portion P2, the fourth portion P4, and the sixth portion P6 on the lower surface WB-B of the preliminary window substrate P-WB. The etching solution ES may be provided by a spray method or a dipping method, but the method is not limited to any one embodiment. The etching solution ES may etch a portion of the preliminary window substrate P-WB around the portions P1 to P7.

The etching solution ES may include an alkali solution. In an embodiment, for example, the etching solution ES may include a sodium hydroxide (NaOH) solution or a potassium hydroxide (KOH) solution, and preferably, the etching solution ES may include a sodium hydroxide solution. The etching solution ES includes an alkali solution, and thus, each of the plurality of groove patterns GVP may have a bottom surface parallel to the upper surface WB-U of the preliminary window substrate P-WB of the substrate and a side surface including at least one curved surface.

The shape of the groove patterns may vary depending on the etching rate or the amount to be etched. As the concentration and temperature of the etching solution ES increase, the etching rate may increase. As the time exposed to the etching solution ES, that is, the etching time increases, the amount to be etched may increase.

In particular, as the temperature of the etching solution ES increases, the reactivity of the etching solution ES increases, and thus, the etching rate may increase. The temperature of the etching solution ES may be equal to or higher than room temperature. In an embodiment, for example, the temperature of the etching solution ES may be about 100 degrees to about 150 degrees. When the temperature of the etching solution ES is lower than about 100 degrees, the reactivity of the etching solution ES may be deteriorated, and the process time for forming the groove patterns may increase. When the temperature of the etching solution ES is higher than about 150 degrees, the preliminary window substrate P-WB may be exposed to high temperatures and may be damaged.

FIG. 11D is a cross-sectional view of the preliminary window substrate P-WB in which a plurality of groove patterns GVP are formed, after a certain period of time has elapsed after exposure to the etching solution ES in the state shown in FIG. 11C.

The plurality of groove patterns GVP may be formed in a manner in which portions of the preliminary window substrate P-WB are recessed through the above-described laser irradiation and etching. The description given above may be applied, in the same manner, to the preliminary window substrate P-WB.

In the method for manufacturing a window according to an embodiment of the invention, the number of columns of laser beams emitted to the positions at which groove patterns are formed, the time for which the laser beams are emitted, the distances between the positions irradiated with the laser beams, and the intensities of laser beams may be adjusted in order to manufacture windows according to various embodiments.

The plurality of groove patterns GVP may include: first groove patterns GVP1 corresponding to the first portion P1, the third portion P3, the fifth portion P5, and the seventh portion P7; and second groove patterns GVP2 corresponding to the second portion P2, the fourth portion P4, and the sixth portion P6.

Figure 11E:
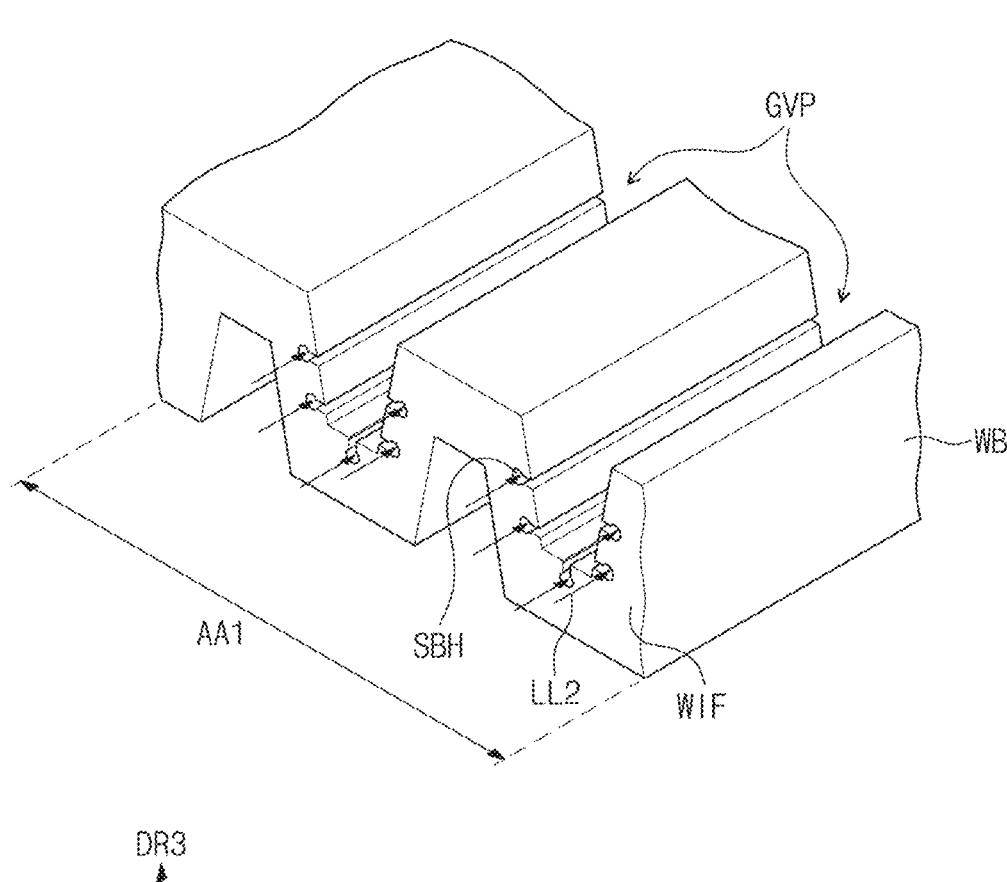

FIG. 11E is a view illustrating an operation of forming a window substrate WB by forming sub grooves SBH in the preliminary window substrate P-WB (see FIG. 11D). Referring to FIG. 11E, second laser beams LL2 may be emitted onto a side surface WIF of the preliminary window substrate P-WB. In an embodiment, for example, the second laser beams LL2 may be emitted, in a second direction DR2, to the side surface WIF of the preliminary window substrate P-WB.

The second laser beam LL2 may have pulse energy. The peak intensity of the second laser beams LL2 may be about 800 nanojoules (nJ) or higher. As the peak intensity of the second laser beams LL2 is set to about 800 nJ or higher, the sub grooves SBH may be formed completely through the side surface WIF of the preliminary window substrate P-WB. The pulse duration of the second laser beam LL2 may vary according to the material or thickness of the preliminary window substrate P-WB.

Referring to FIG. 7B together, a second sub groove SBH2 may be formed, and then, a first sub groove SBH1 may be formed. The first sub groove SBH1 and the second sub groove SBH2 may be formed such that the maximum width Ws2 of the second sub groove SBH2 is greater than the width Ws1 of the first sub groove SBH1 by adjusting the intensities and irradiation times of the second laser beams LL2. In an embodiment, for example, the width Ws1 of the first sub groove SBH1 may be about 5 μm to about 10 μm, and the maximum width Ws2 of the second sub groove SBH2 may be about 15 μm to about 20 μm.

The second laser beams LL2 may be emitted onto a plurality of points on the side surface WIF of the preliminary window substrate P-WB. The second laser beams LL2 may pass through the plurality of points on the side surface WIF, thereby forming the plurality of sub grooves SBH. Although not shown, an upper sub groove SBH-U may be formed in the first groove pattern GVP1 and a lower sub groove SBH-B may be formed in the second groove pattern GVP2 as shown in FIG. 8.

Figure 11F:
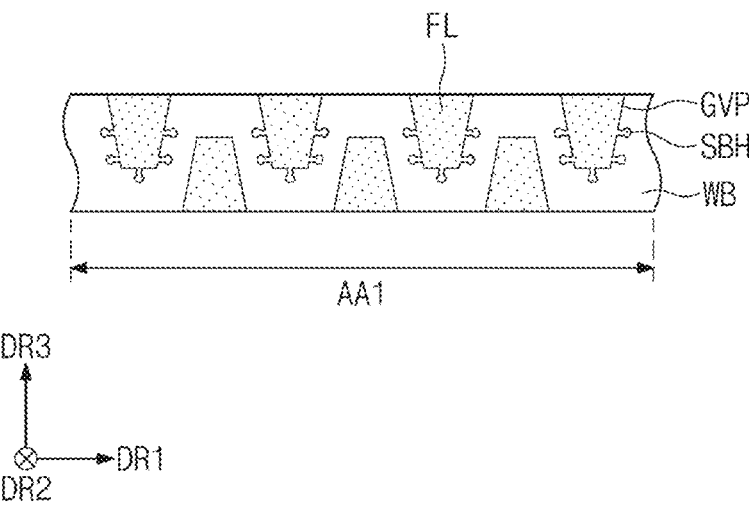

FIG. 11F is a view illustrating an operation of filling the plurality of groove patterns GVP and the sub grooves SBH with fillers FL. Although not shown, preliminary filling members are provided in the plurality of groove patterns GVP and the sub grooves SBH. Subsequently, the preliminary filling members may be cured to form the fillers FL. The curing of the preliminary filling members may include a photo-curing operation of emitting UV light.

Each of the fillers FL may include an elastic material. The filler FL may include an organic material. In an embodiment, for example, the filler FL may include a resin having elasticity. The fillers FL may prevent the window WP from being deformed due to compressive or tensile stress applied during folding, while maintaining improved folding characteristics of the window WP. The fillers FL may include an optically transparent material.

Referring to FIGS. 2A, 6, 7A, and 7B together, the fillers FL may completely fill the inner spaces of the plurality of groove patterns GVP and the sub grooves SBH. As the fillers FL fill the inner spaces of the sub grooves SBH, even though the fillers FL in the first groove patterns GVP1 are subjected to tensile stress, the fillers FL filling the sub grooves SBH are attracted in the opposite direction to the tensile stress by the sub grooves SBH, and thus, the fillers FL may remain attached to the first side surfaces IF1. No space is generated between the filler FL and the first side surface IF1. Therefore, it is possible to prevent light generated from the display surface DS of the display module DM overlapping the first region AA1 of the window WP in a plan view from being viewed, and thus, the reliable display device DD may be provided.

Figure 11G:
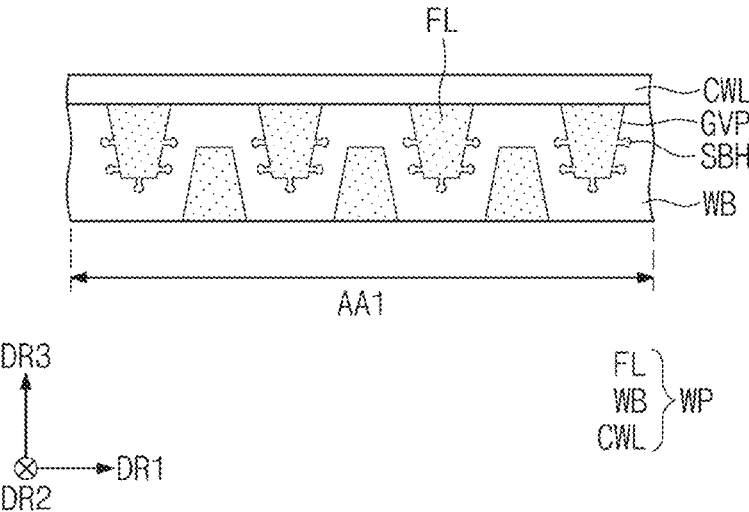

FIG. 11G is a view illustrating an operation of disposing a window cover layer CWL on the window substrate WB.

The window cover layer CWL may serve to protect the window substrate WB from external impact. However, the embodiment is not limited thereto, and the window cover layer CWL may provide various functions. In an embodiment, for example, the window cover layer CWL may provide an anti-fingerprint function, an anti-contamination function, an anti-reflection function, and an anti-glare function.

The window cover layer CWL may be directly provided on the upper surfaces of the window substrate WB and the fillers FL. Although not shown, an adhesive may be provided between the window cover layer CWL and the window substrate WB. The window cover layer CWL may be provided in the form of a film and attached to the window substrate WB by the adhesive, but the embodiment is not limited thereto. The window cover layer CWL may be applied on the window substrate WB through various coating methods, such as spin coating, inkjet coating, and bar coating. The operation of disposing the window cover layer CWL may be omitted.

As the sub grooves recessed into the window substrate are provided in the groove patterns provided in the window according to an embodiment of the invention, even if the fillers filling the groove patterns receive tensile stress when the window is folded, the fillers are attracted in a direction opposite to the tensile stress by the sub groove, and thus, the side surfaces of the groove patterns and the fillers may remain attached to each other. Therefore, since no gap is generated between the side surface of the groove pattern and the filler, it is possible to prevent light generated from the display surface from being visually recognized. Accordingly, a reliable display device may be provided.

Although the present disclosure has been described with reference to the embodiments, it will be understood that various changes and modifications of the present disclosure may be made by one ordinary skilled in the art or one having ordinary knowledge in the art without departing from the spirit and technical field of the disclosure as hereinafter claimed.

Accordingly, the technical scope of the disclosure should not be limited by the foregoing description, but rather should be defined only by the following claims.

What is claimed is:

1. A window comprising:
   a window substrate comprising a bending portion bendable about a bending axis that extends in a first direction;
   a plurality of groove patterns recessed from a surface of the window substrate, which are defined in the bending portion, extend in the first direction, and are arranged in a second direction crossing the first direction;
   a sub groove, which is further recessed into the window substrate from a pattern surface that defines at least one of the plurality of groove patterns; and
   fillers, which fill the plurality of groove patterns and the sub groove,
   wherein the sub groove comprises:
   a fixing region having a width that increases in a direction in which the sub groove is further recessed such that in a cross-sectional view perpendicular to the first direction,
   a first sub groove portion adjacent to the pattern surface and having a constant width over a length in the direction in which the sub groove is further recessed; and
   a second sub groove portion extending from the first sub groove portion in the direction in which the sub groove is further recessed with a circular cross-section having a diameter exceeding the constant width, the second sub groove portion comprising the fixing region.

2. The window of claim 1, wherein each of the plurality of groove patterns comprises pattern side surfaces extending from a pattern lower surface to the surface of the window substrate.

3. The window of claim 1, wherein the plurality of groove patterns comprise an upper groove pattern recessed from an upper surface of the window substrate and a lower groove pattern recessed from a lower surface of the window substrate.

4. The window of claim 3, wherein the upper groove pattern and the lower groove pattern do not overlap each other in the thickness direction of the window substrate.

5. The window of claim 3, wherein the upper groove pattern is provided in plurality arranged in the second direction and the lower groove pattern is provided in plurality arranged in the second direction, wherein the plurality of upper groove patterns and the plurality of lower groove patterns do not overlap each other in the thickness direction of the window substrate.

6. The window of claim 3, wherein the sub groove is provided in plurality comprising:

an upper sub groove provided in the upper groove pattern; and a lower sub groove provided in provided in the lower groove pattern.

7. The window of claim 1, wherein the sub groove is provided in plurality, and each of the plurality of groove patterns is provided with a plurality of sub grooves.

8. The window of claim 7, wherein each of the plurality of groove patterns comprises pattern side surfaces extending from a pattern lower surface to the surface of the window substrate, wherein the pattern lower surface comprises at least one of the plurality of sub grooves and the pattern side surfaces each include at least one of the plurality of sub grooves.

9. The window of claim 1, wherein in the cross-sectional view perpendicular to the first direction, the pattern surface is separated into two sections by the sub groove.

10. The window of claim 1, wherein the window substrate further comprises a first non-bending portion and a second non-bending portion which are spaced apart from each other in the second direction with the bending portion therebetween.

11. The window of claim 1, further comprising a window cover layer on the window substrate.

12. A display device operating in a first mode and a second mode in which the display surface is larger than in the first mode, the display device comprising:

a display panel comprising a display bending portion bendable about a virtual bending axis that extends in the first direction;

a window substrate, which is disposed on the display panel and comprises a bending portion corresponding to the display bending portion;

a plurality of groove patterns recessed from a surface of the window substrate, which are defined in the bending portion, extend in the first direction, and are arranged in a second direction crossing the first direction;

a sub groove, which is further recessed into the window substrate from a pattern surface that defines at least one of the plurality of groove patterns; and fillers, which fill the plurality of groove patterns and the sub groove, wherein the sub groove comprises:

a fixing region having a width that increases in a direction in which the sub groove is further recessed such that in a cross-sectional view perpendicular to the first direction, a first sub groove portion adjacent to the pattern surface and having a constant width over a length in the direction in which the sub groove is further recessed; and a second sub groove portion extending from the first sub groove portion in the direction in which the sub groove is further recessed with a circular cross-section having a diameter exceeding the constant width, the second sub groove portion comprising the fixing region.

13. A window comprising:

a window substrate comprising a bending portion bendable about a bending axis that extends in a first direction;

a plurality of groove patterns recessed from a surface of the window substrate, which are defined in the bending portion, extend in the first direction, and are arranged in a second direction crossing the first direction;

a sub groove, which is further recessed into the window substrate from a pattern surface that defines at least one of the plurality of groove patterns; and fillers, which fill the plurality of groove patterns and the sub groove, wherein, in a cross-sectional view perpendicular to the first direction, the sub groove has an anchor shape with a first sub groove portion adjacent the pattern surface and having a uniform width over a length and a distal end connected to a second sub groove portion having a circular shape with a diameter exceeding the uniform width such that the fillers are fixed to the sub groove.

14. The window of claim 13, wherein the plurality of groove patterns comprise an upper groove pattern recessed from an upper surface of the window substrate and a lower groove pattern recessed from a lower surface of the window substrate.

15. The window of claim 14, wherein the upper groove pattern is provided in plurality arranged in the second direction and the lower groove pattern is provided in plurality arranged in the second direction, wherein the plurality of upper groove patterns and the plurality of lower groove patterns do not overlap each other in the thickness direction of the window substrate.

16. The window of claim 13, wherein each of the plurality of groove patterns comprises pattern side surfaces extending from a pattern lower surface to the surface of the window substrate.

17. The window of claim 16, wherein the sub groove is provided in plurality, and each of the plurality of groove patterns is provided with a plurality of sub grooves.

18. The window of claim 17, wherein the pattern lower surface comprises at least one of the plurality of sub grooves and the pattern side surfaces each include at least one of the plurality of sub grooves.

19. The window of claim 13, wherein in the cross-sectional view perpendicular to the first direction, the pattern surface is separated into two sections by the sub groove.

20. A display device operating in a first mode and a second mode in which a display device is larger than in the first mode, the display device comprising:

a display panel comprising a display bending portion corresponding to the window substrate bending portion; and the window substrate of the window of claim 13 being disposed on the display panel.

* * * * *